United States Patent
Lim et al.

(10) Patent No.: US 11,430,665 B2
(45) Date of Patent: Aug. 30, 2022

(54) METHODS OF MANUFACTURING SEMICONDUCTOR DEVICES AND APPARATUSES FOR MANUFACTURING THE SAME

(71) Applicant: Samsung Electronics Co., Ltd., Suwon-si (KR)

(72) Inventors: Taisoo Lim, Seoul (KR); Kyungwook Park, Daegu (KR); Wangyup Ryu, Busan (KR); Keun Lee, Seongnam-si (KR); Changwoo Lee, Suwon-si (KR); Hauk Han, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 98 days.

(21) Appl. No.: 16/928,548

(22) Filed: Jul. 14, 2020

(65) Prior Publication Data
US 2021/0159086 A1  May 27, 2021

(30) Foreign Application Priority Data
Nov. 21, 2019  (KR) .................. 10-2019-0150270

(51) Int. Cl.
*C23C 16/08* (2006.01)
*H01L 21/3205* (2006.01)
(Continued)

(52) U.S. Cl.
CPC .. *H01L 21/32051* (2013.01); *H01L 21/28556* (2013.01); *H01L 21/67346* (2013.01); *C23C 16/08* (2013.01); *C23C 16/45525* (2013.01)

(58) Field of Classification Search
CPC ......... H01L 21/76877; H01L 21/32051; H01L 21/28556; H01L 21/0228; H01L 21/768;
(Continued)

(56) References Cited

U.S. PATENT DOCUMENTS 6,964,790 B1   11/2005  Nasu et al.
8,147,786 B2    4/2012  Tsuda
(Continued)

FOREIGN PATENT DOCUMENTS

JP         2012-062502 A      3/2012

*Primary Examiner* — Selim U Ahmed
*Assistant Examiner* — Evan G Clinton
(74) *Attorney, Agent, or Firm* — Harness, Dickey & Pierce, P.L.C.

(57) ABSTRACT

A method of manufacturing a semiconductor device may include forming a stack structure by alternately stacking sacrificial layers and interlayer insulating layers on a substrate, forming channel structures extending through the stack structure, forming openings extending through the stack structure, forming lateral openings by removing the sacrificial layers exposed by the openings, and forming gate electrodes in the lateral openings. Forming the gate electrodes may include supplying a source gas containing tungsten (W) wherein the source gas is heated to a first temperature and is supplied in a deposition apparatus at the first temperature, supplying a reactant gas containing hydrogen (H) subsequently to supplying the source gas, wherein the reactant gas is heated to a second temperature and is supplied in the deposition apparatus at the second temperature, and supplying a purge gas subsequently to supplying the reactant gas.

19 Claims, 17 Drawing Sheets

(51) Int. Cl.
*H01L 21/285* (2006.01)
*H01L 21/673* (2006.01)
*C23C 16/455* (2006.01)

(58) Field of Classification Search
CPC ........... H01L 2924/01074; C23C 16/08; C23C 16/45525
See application file for complete search history.

(56) References Cited

U.S. PATENT DOCUMENTS

| | | |
|---|---|---|
| 9,157,152 B2 | 10/2015 | Faguet et al. |
| 10,047,436 B2 | 8/2018 | Moroi |
| 2005/0070100 A1* | 3/2005 | Yamasaki ............... C23C 16/16 257/E21.17 |
| 2006/0009034 A1* | 1/2006 | Lai .................... H01L 21/76843 257/E21.585 |
| 2010/0233876 A1 | 9/2010 | Matsumoto et al. |
| 2015/0279735 A1 | 10/2015 | Hotta et al. |
| 2017/0029948 A1* | 2/2017 | Jongbloed ......... C23C 16/45527 |
| 2019/0287982 A1* | 9/2019 | Hinoue ............. H01L 23/53266 |
| 2020/0303222 A1* | 9/2020 | Obara ..................... C23C 16/34 |
| 2021/0335617 A1* | 10/2021 | Deng ................ H01L 21/28562 |

* cited by examiner

METHODS OF MANUFACTURING SEMICONDUCTOR DEVICES AND APPARATUSES FOR MANUFACTURING THE SAME

CROSS-REFERENCE TO RELATED APPLICATION

This application claims benefit of priority under 35 U.S.C. § 119 to Korean Patent Application No. 10-2019-0150270, filed on Nov. 21, 2019 in the Korean Intellectual Property Office, the disclosure of which is incorporated herein by reference in its entirety.

BACKGROUND

1. Field

The present inventive concepts relate to methods of manufacturing semiconductor devices and apparatuses for manufacturing semiconductor devices.

2. Description of Related Art

As demand for high performance, high speed, and/or multi-functionalization in semiconductor devices is increased, a degree of integration of such semiconductor devices is also increased. As one method of increasing a degree of integration of semiconductor elements, a semiconductor device having a vertical transistor structure in place of a conventional planar transistor structure has been proposed.

SUMMARY

Some example embodiments of the present inventive concepts provide methods of manufacturing a semiconductor device with improved reliability. Some example embodiments of the present inventive concepts provide apparatuses for manufacturing semiconductor devices.

According to some example embodiments of the present inventive concepts, a method of manufacturing a semiconductor device may include forming a stack structure by alternately stacking a plurality of sacrificial layers and a plurality of interlayer insulating layers on a substrate, forming a plurality of channel structures separately extending through the stack structure, forming a plurality of openings separately extending through the stack structure, forming a plurality of lateral openings by removing the plurality of sacrificial layers exposed by the plurality of openings, forming a plurality of gate electrodes in separate, respective lateral openings of the plurality of lateral openings, and forming a wiring structure in an upper portion of the gate electrodes. The forming the gate electrodes may include forming a nucleation layer in the plurality of lateral openings, by supplying a source gas and a first reactant gas, and forming a bulk layer on the nucleation layer to fill the plurality of lateral openings, by supplying the source gas and a second reactant gas, the second reactant gas being different from the first reactant gas. The source gas may be heated to a first temperature and is supplied from a gas supply unit in a deposition apparatus at the first temperature, the second reactant gas may be heated to a second temperature and is supplied from the gas supply unit in the deposition apparatus at the second temperature, and the first reactant gas may be supplied without being heated and is supplied at a third temperature that is lower than the first temperature and lower than the second temperature.

According to some example embodiments of the present inventive concepts, a method of manufacturing a semiconductor device may include forming a stack structure by alternately stacking a plurality of sacrificial layers and a plurality of interlayer insulating layers on a substrate, forming a plurality of channel structures separately extending through the stack structure, forming a plurality of openings separately extending through the stack structure, forming a plurality of lateral openings by removing the plurality of sacrificial layers exposed by the plurality of openings, and forming a plurality of gate electrodes in the plurality of lateral openings. The forming the plurality of gate electrodes may include supplying a source gas containing tungsten (W), wherein the source gas is heated to a first temperature and is supplied in a deposition apparatus at the first temperature, supplying a reactant gas containing hydrogen (H), wherein the reactant gas is heated to a second temperature and is supplied in the deposition apparatus at the second temperature, and supplying a purge gas.

According to some example embodiments of the present inventive concepts, a method of manufacturing a semiconductor device may include forming a nucleation layer on a substrate, by supplying a source gas and a first reactant gas into a deposition chamber in a deposition apparatus, the deposition chamber being at a deposition temperature. The method may include forming a bulk layer on the nucleation layer, by supplying the source gas and a second reactant gas into the deposition chamber, the deposition chamber being at the deposition temperature. The source gas may be heated to a first temperature and may be supplied from a gas supply unit in the deposition apparatus at the first temperature. The second reactant gas may be heated to a second temperature and may be supplied from the gas supply unit in the deposition apparatus at the second temperature. The first and second temperatures may be both lower than the deposition temperature.

According to some example embodiments of the present inventive concepts, an apparatus for manufacturing a semiconductor device may include a deposition chamber including a substrate support portion configured to support a substrate and a gas injector on the substrate support portion and configured to eject a plurality of process gases onto the substrate, a gas supply configured to supply the plurality of process gases to the deposition chamber, the plurality of process gases including a source gas, a first reactant gas, a second reactant gas, and a purge gas, and a gas discharge configured to discharge residual gases from the deposition chamber. The gas supply may include a plurality of gas sources configured to supply separate, respective process gases of the plurality of process gases, the plurality of gas sources including a first gas source configured to supply the source gas, to the deposition chamber, a second gas source configured to supply the second reactant gas to the deposition chamber, and a third gas source configured to supply the first reactant gas to the deposition chamber. The gas supply may include a plurality of mass flow controllers (MFC) each configured to control a feed flow rate of one or more process gases of the plurality of process gases, a plurality of valves each configured to selectively pass or block one or more process gases of the plurality of process gases, and a plurality of gas lines extended from the plurality of gas sources to the deposition chamber, the plurality of gas lines including a source gas line configured to direct the source gas from the first gas source to the deposition chamber, a second reactant gas line configured to direct the second reactant gas from the second gas source to the deposition chamber, and a first reactant gas line configured to direct the first reactant gas from the third gas source to the deposition chamber. The gas supply may include a plurality of first heaters surrounding the source gas line and the second reactant gas line. The first reactant gas line may be spaced apart from the plurality of first heaters.

According to some example embodiments of the present inventive concepts, an apparatus for manufacturing a semiconductor device may include a deposition chamber including a substrate support portion configured to support a substrate and a gas injector on the substrate support portion, and configured to eject a plurality of process gases onto the substrate, and a gas supply configured to supply the plurality of process gases to the deposition chamber. The gas supply may include a plurality of gas sources configured to supply separate, respective process gases of the plurality of process gases, a plurality of gas lines extended from the plurality of gas sources to the deposition chamber, and a plurality of heaters surrounding separate, respective gas lines of at least a portion of the plurality of gas lines. The plurality of heaters may be configured to heat process gases supplied in the portion of the plurality of gas lines to respective temperatures that are each in a range from about 80° C. to about 150° C.

BRIEF DESCRIPTION OF DRAWINGS

The above and other aspects, features and other advantages of the present disclosure will be more clearly understood from the following detailed description, taken in conjunction with the accompanying drawings, in which.

DETAILED DESCRIPTION

Hereinafter, example embodiments of the present disclosure will be described in more detail with reference to the attached drawings.

Figure 1:
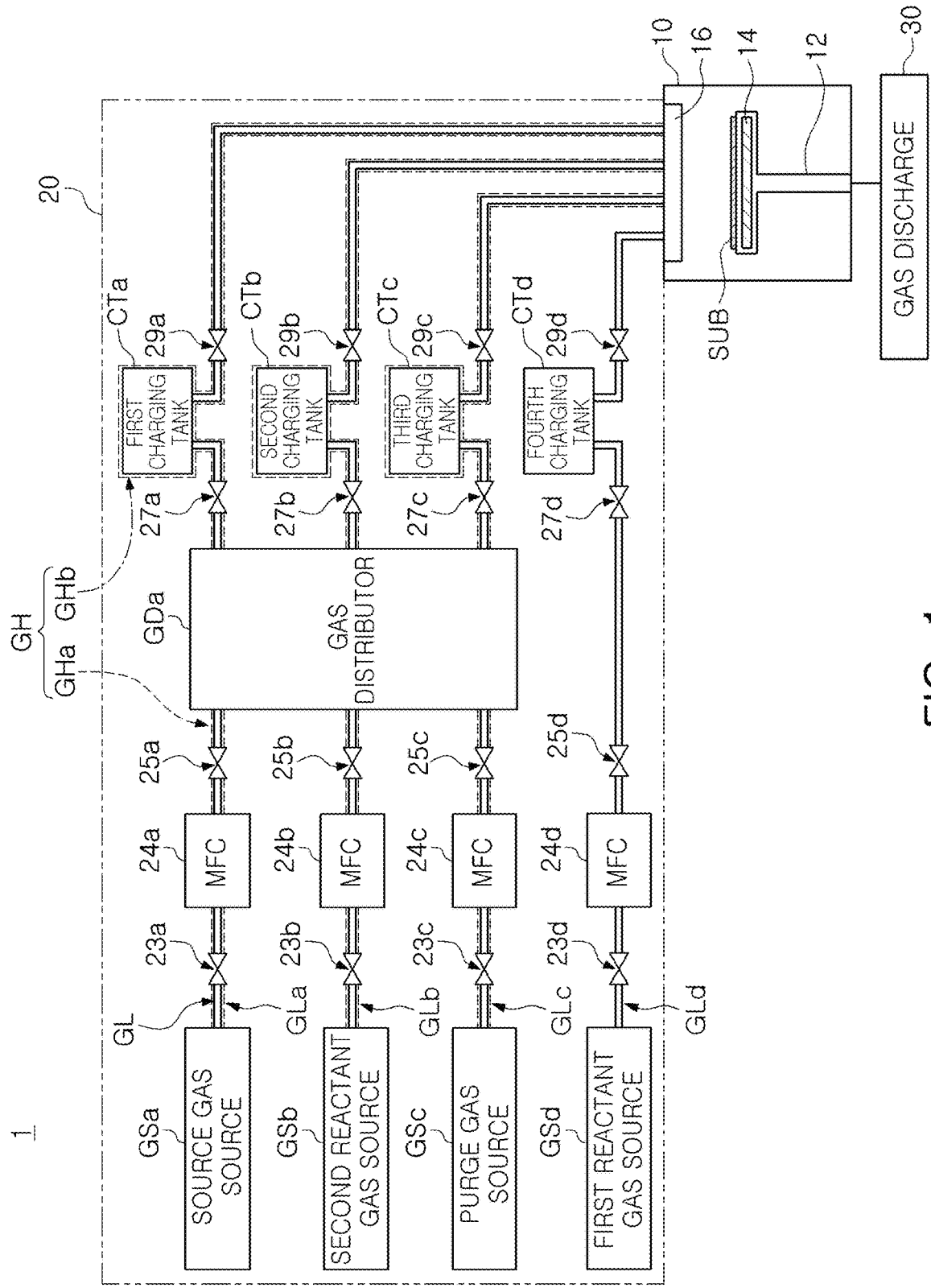
FIG. 1 is a schematic view of an apparatus for manufacturing a semiconductor device according to some example embodiments.

FIG. 1 is a schematic view of an apparatus for manufacturing a semiconductor device according to some example embodiments.

Referring to FIG. 1, an apparatus for manufacturing a semiconductor device 1 includes a deposition chamber 10, a gas supply unit 20 (also referred to herein as simply a "gas supply"), and a gas discharge unit 30 (also referred to herein as simply a "gas discharge"). In the apparatus for manufacturing a semiconductor device 1, process gases such as a source gas, reactant gases, a purge gas, and the like are supplied from the gas supply unit 20, so deposition is performed on a substrate SUB of a semiconductor device in the deposition chamber 10, and residual gases may be exhausted by the gas discharge unit 30. The apparatus for manufacturing a semiconductor device 1 may be referred to herein as a "deposition apparatus." The apparatus for manufacturing a semiconductor device 1 may be an apparatus for formation of a thin film on a substrate SUB, and may be an atomic layer deposition (ALD) apparatus, for example.

The deposition chamber 10 may be a region on which a deposition process is performed. The deposition chamber 10 may include a substrate support portion 12 configured to support a substrate SUB on which deposition is performed, a substrate heating unit 14 configured to heat the substrate SUB, and a gas injector 16 configured to eject the process gases, supplied by the gas supply unit 20, onto the substrate SUB. Restated, the gas supply unit 20 is configured to supply process gases, for example a source gas, a first reactant gas, a second reactant gas, and/or a purge gas, as described herein, to the deposition chamber 10, for example to the gas injector 16 to cause the gas injector 16 to eject said process gases onto the substrate SUB. As shown in FIG. 1, the gas injector 16 is positioned over the substrate support portion 12 (e.g., above the substrate support portion 12) to face an upper surface of the substrate support portion 12 on which the substrate SUB is supported, and thus the gas injector 16 may be described to be "on" the substrate support portion 12, for example such that the substrate SUB is supported between the substrate support portion 12 and the gas injector 16. A substrate SUB heating temperature by the substrate heating unit 14, that is, a deposition temperature, may ranges from about 200° C. to about 750° C., and may be higher than a gas heating temperature by a heating unit GH of the gas supply unit 20, described below. As described herein, heating units may be referred to as "heaters." The deposition chamber 10 may further include a power supply unit generating an electric field and/or plasma and an arm portion for conveying the substrate SUB thereinto and therefrom. The substrate SUB may be, for example, a silicon wafer used in the manufacture of a semiconductor integrated circuit (IC). However, the configuration, structure, and arrangement of the deposition chamber 10 are exemplary, and may be variously changed in some example embodiments.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

The gas supply unit 20 may include a plurality of (e.g., first to fourth) gas sources GSa to GSd, a plurality of (e.g., first to fourth) mass flow controllers (MFCs) 24a, 24b, 24c, and 24d, a gas distributor GDa, and a plurality of (e.g., first to fourth) charging tanks CTa, CTb, CTc, and CTd. The gas supply unit 20 may further include a plurality of gas lines GL (e.g., first to fourth gas lines GLa to GLd), also referred to as gas flow conduits, extended from the first to fourth gas sources GSa to GSd to the deposition chamber 10 along the components, and may further include heating units GH surrounding some gas lines GL and first to third charging tanks CTa, CTb, and CTc. The gas supply unit 20 may further include first valves 23a, 23b, 23c, and 23d disposed at the front end of the first to fourth MFCs 24a, 24b, 24c, and 24d between the first to fourth gas sources GSa to GSd and the first to fourth MFCs 24a, 24b, 24c, and 24d, second valves 25a, 25b, 25c, and 25d disposed at the rear end of the first to fourth MFCs 24a, 24b, 24c, and 24d, third valves 27a, 27b, 27c, and 27d disposed at the front end of the first to fourth charging tanks CTa, CTb, CTc, and CTd, and fourth valves 29a, 29b, 29c, and 29d disposed between the first to fourth charging tanks CTa, CTb, CTc, and CTd and the deposition chamber 10. The first to fourth charging tanks CTa, CTb, CTc, and CTd may be configured to charge and supply the plurality of process gases to the deposition chamber 10.

The first to fourth gas sources GSa to GSd may supply a source gas, a second reactant gas, a purge gas, and a first reactant gas, respectively, to the deposition chamber 10. Restated, the gas sources GSa to GSd may be configured to supply separate, respective process gases of the plurality of process gases. However, in some example embodiments, the number of gas sources GSa to GSd may be variously changed depending on the type of process gases used. For example, the gas supply unit 20 may include two or more source gas sources, or the fourth gas source GSd may be omitted when a first reactant gas and a second reactant gas are the same substance.

In some example embodiments, the apparatus for manufacturing a semiconductor device 1 may be an apparatus of depositing tungsten (W). In this case, the first gas source GSa, a source gas source, may supply at least one of $WF_6$, $WCl_6$, $WCl_5$, $W(CO)_6$, $W(C_6H_6)_2$, $W(PF_3)_6$, $W(allyl)_4$, (1, 5-COD)$W(CO)_4$, or $(C_5H_5)_2WH_2$, and for example, may supply $WF_6$ in a gas state. The second gas source GSb, a second reactant gas source, may supply $H_2$, the third gas source GSc, a purge gas source, may supply at least one of Ar, He, or $N_2$, and the fourth gas source GSd, the first reactant gas source, may supply at least one of $B_2H_6$, $SiH_4$, or $GeH_4$.

The first to fourth MFCs 24a, 24b, 24c, and 24d may adjust feed flow rates of process gases supplied from the first to fourth gas sources GSa to GSd. The first to fourth MFCs 24a, 24b, 24c, and 24d are illustrated as one MFC provided for each of the first to fourth gas sources GSa to GSd, but are not limited thereto. For example, the first to fourth MFCs may also be possible to be provided as two or more MFCs for each of the first to fourth gas sources GSa to GSd. In some example embodiments, the MFCs 24a to 24d may each be configured to control a feed flow rate of one or more process gases of the plurality of process gases supplied from gas sources GSa to GSd. In some example embodiments, the MFCs 24a to 24d may each be configured to control a feed flow rate of a separate process gas of the plurality of process gases supplied from gas sources GSa to GSd. In some example embodiments, the feed flow rate of each separate process gas may be controlled by a separate set of one or more MFCs of the total MFCs of the apparatus for manufacturing a semiconductor device 1.

As shown in FIG. 1, the gas distributor GDa may be between at least portion of the first to fourth MFCs 24a to 24d and the gas injector 16. The gas distributor GDa may distribute and supply each of at least some process gases to a plurality of locations in the deposition chamber 10. The gas distributor GDa may be disposed to distribute the process gases, supplied from the first to third gas sources GSa to GSc. However, in FIG. 1, for convenience, even after passing through the gas distributor GDa, a single gas line GL is only illustrated for each of the first to third gas sources GSa to GSc. Each of the source gas, the second reactant gas, and the purge gas, may be separately distributed within the gas distributor GDa. According to some example embodiments, the fourth gas source GSd may also be connected to the gas distributor GDa.

The first to fourth charging tanks CTa, CTb, CTc, and CTd may be gas filling tanks for filling process gases at a constant volume and then supplying the process gases at high injection volumes instantly. The first to fourth charging tanks CTa, CTb, CTc, and CTd are illustrated as one charging tank provided for each of the first to fourth gas sources GSa to GSd, but are not limited thereto. For example, the first to fourth charging tanks may also be possible to provide as two or more charging tanks for each of the first to fourth gas sources GSa to GSd.

The first valves 23a, 23b, 23c, and 23d, the second valves 25a, 25b, 25c, and 25d, the third valves 27a, 27b, 27c, and 27d, as well as the fourth valves 29a, 29b, 29c, and 29d may each be configured to selectively pass or block one or more gases flowing along the gas lines GL, and it is also possible that some may be omitted or added according to some example embodiments.

The heating units GH may include first heating units GHa (also referred to herein as "first heaters") surrounding gas lines GL around some gas lines GL (e.g., surrounding separate, respective gas lines of some of the gas lines GL, for example surrounding separate respective ones of the first to third gas lines GLa to GLc) and second heating units GHb (also referred to herein as "second heaters") surrounding first to third charging tanks CTa, CTb, and CTc around the first to third charging tanks CTa, CTb, and CTc. For example, the second heaters GHb may surround separate, respective charging tanks of a portion of the plurality of charging tanks CTa to CTd, for example may surround separate, respective first to third charging tanks CTa to CTc but none of the second heating units GHb may surround the fourth charging tank CTd. The heating units GH are indicated by dotted lines in FIG. 1, and the first heating units GHa may be disposed to surround the gas lines GL extended from the first gas source GSa supplying a source gas and the second gas source GSb supplying a second reactant gas, among the gas lines GL. Restated, the gas lines GL may include a source gas line (e.g., first gas line GLa) configured to direct the source gas from the first gas source GSa to the deposition chamber 10 and a second reactant gas line (e.g., second gas line GLb) configured to direct the second reactant gas from the second gas source GSb to the deposition chamber 10, and the first heating units GHa may surround the source gas line GLa and the second reactant gas line GLb. The gas lines GL may further include a first reactant gas line (e.g., fourth gas line GLd) configured to direct the first reactant as from the fourth gas source GSd to the deposition chamber 10, and the first reactant gas line (e.g., GLd) may be spaced apart from (e.g., isolated from direct contact with) the first heating units GHa such that the first heating units GHa do not surround the first reactant gas line (e.g., GLd). In some example embodiments, the plurality of first heating units GHa may surround separate, respective gas lines of the first to third gas lines GLa to GLc. In some example embodiments, the plurality of first heating units may not surround the fourth gas line GLd. In addition, the heating unit GHa may be disposed to surround a gas line GL extended from the third gas source GSc supplying a purge gas. As described above, the heating units GH may be disposed to heat the supplied gases separately.

A gas line GL, extended from the fourth gas source GSd, among the gas lines GL, and the fourth charging tank CTd, may not be surrounded by the heating unit GH. However, according to some example embodiments, a the gas line GLc, extended from the third gas source GSc supplying a purge gas, and the third charging tank CTc, may or may not be surrounded by the heating unit GH. Moreover, according to some example embodiments, it is also possible that the heating units GH include the first heating units GHa or the second heating units GHb.

The heating units GH may have a shape of a heat jacket or a heat tape surrounding the gas lines GL and the first to third charging tanks CTa, CTb, and CTc. This will be described below in more detail with reference to FIGS. 6 to 7B. However, a specific shape of the heating units GH may be variously changed in some example embodiments. The heating units GH may be configured to heat process gases supplied in the portion of the plurality of gas lines GL that are surrounded by at least a portion of the heating units GH (e.g., first to third gas lines GLa to GLC that are surrounded by first heating units GHa) to respective temperatures that are each in a range from about 80° C. to about 150° C. The fourth gas line GLd may be configured to supply the first reactant gas to the deposition chamber 10 without the first reactant gas being heated, such that the first reactant gas is supplied (e.g., arrives at the deposition chamber 10) at a temperature in a range from about 4° C. to about 40° C.

As described above, the apparatus for manufacturing a semiconductor device 1 may have a structure further including heating units GH of the gas supply unit 20, in addition to the substrate heating unit 14 in the deposition chamber 10. Due to the arrangement of the heating units GH, the source gas, the second reactant gas, and the purge gas are heated and supplied, and the first reactant gas may be supplied without being heated. A heating temperature of the gases by the heating units GH may, for example, ranges from about 80° C. to about 150° C., and particularly, ranges from about 100° C. to about 150° C. The temperature range may be a temperature in a range in which the gases could have the increased particle velocity and energy without pyrolysis. If the heating temperature is lower than the above range, the effect such as an increase in a deposition rate due to heating may not be obtained. If the heating temperature is higher than the above range, some gases may be pyrolyzed before the gases reach the deposition chamber 10. In some example embodiments, respective heating temperatures of the source gas, the second reactant gas, and the purge gas may be the same as or different from each other. Accordingly, specific configurations, such as thicknesses and materials of the heating units GH may be different from each other.

The first reactant gas may be a gas with relatively low thermal stability. The first reactant gas may be supplied as an unheated gas. For example, the first reactant gas may be supplied at a temperature of about 4° C. to about 40° C., and particularly, at a temperature of about 15° C. to about 30° C. If a temperature of the first reactant gas is lower than the above range, a deposition rate may be lowered. If the temperature thereof is higher than the above range, the first reactant gas is solidified, so the first reactant gas is not supplied properly.

A gas line GL, extended from the fourth gas source GSd, is spaced apart from the heating units GH in the gas supply unit 20, and thus thermal interference caused by the heating units GH may be significantly reduced. In some example embodiments, the first to third gas sources GSa to GSc and the fourth gas source GSd may be physically spaced apart or may be located separately in separate spaces. Thus, the first to third MFCs 24a, 24b, and 24c, the gas distributor GDa, the first to third charging tanks CTa, CTb, and CTc, connected to the first to third gas sources GSa to GSc, and gas lines GL extended along them, may be spaced apart from configurations corresponding to the fourth gas source GSd.

The gas discharge unit 30 may discharge a reaction byproduct and a residual gas in the deposition chamber 10 externally. Restated, the gas discharge unit 30 may be configured to discharge residual gases from the deposition chamber 10. The gas discharge unit 30 may include a vacuum pump, and the materials in the deposition chamber 10 may be discharged externally by a vacuum suction force generated by the vacuum pump.

Figure 2:
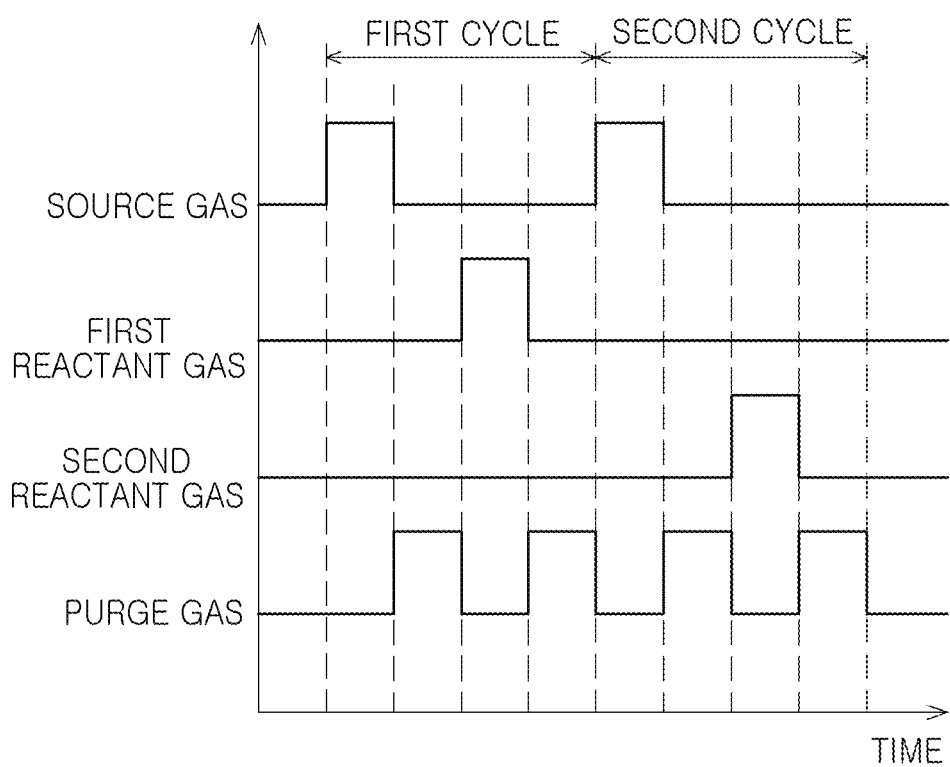
FIG. 2 is a gas injection flow diagram illustrating a method of manufacturing a semiconductor device using an apparatus for manufacturing a semiconductor device according to some example embodiments.

FIG. 2 is a gas injection flow diagram illustrating a method of manufacturing a semiconductor device using an apparatus for manufacturing a semiconductor device according to some example embodiments.

Referring to FIG. 2, a gas injection flow diagram is illustrated, for depositing a conductive layer including a nucleation layer and a bulk layer in the apparatus for manufacturing a semiconductor device 1 in FIG. 1.

The nucleation layer is formed first to provide a nucleation site assisting nucleation for growth of a bulk layer subsequently. The bulk layer grows based on the nucleation layer, and thus may form a conductive layer at a desired thickness.

First, for deposition of the nucleation layer, gases may be injected. Here, the gases include a source gas, a first reactant gas, and a purge gas. The above process includes supplying of a source gas and supplying of a first reactant gas, and may further include injecting of a purge gas after each supplying operation. The operations are provided as one deposition cycle and a first cycle is repeated, thereby forming a nucleation layer. In the gas supply unit 20 of the apparatus for manufacturing a semiconductor device 1, the source gas and the purge gas are heated and supplied, and the first reactant gas is supplied without being heated.

The source gas may include a precursor containing a material forming the nucleation layer. The precursor may be supplied in gaseous state. The first reactant gas is provided to assist nucleation of the precursor, and may be a gas oxidizing or reducing the precursor. The purge gas may be Ar, He, $N_2$, or the like, may remove remaining byproducts and the unabsorbed source gas and first reactant gas. For example, when the nucleation layer is formed of tungsten (W), the source gas is $WF_6$, and the first reactant gas is at least one of $B_2H_6$, $SiH_4$, or $GeH_4$. The first reactant gas may have a lower pyrolysis temperature and higher reactivity as compared with the second reactant gas subsequently used for formation of the bulk layer. Thus, the first reactant gas may be supplied without being heated, as described above.

Next, for formation of the bulk layer, gases may be injected, including a source gas, a second reactant gas, and a purge gas. The above process includes supplying of a source gas and supplying of a second reactant gas, and may include injecting of a purge gas after each supplying operation. The operations are provided as one deposition cycle and a second cycle is repeated, thereby forming a bulk layer. In the gas supply unit 20 of the apparatus for manufacturing a semiconductor device 1, the source gas, the second reactant gas, and the purge gas are heated and supplied.

First, the source gas and the purge gas may be gases the same as that used in the formation of the nucleation layer, but are not limited thereto. In some example embodiments, the second reactant gas may be a material different from the first reactant gas used in the formation of the nucleation layer. For example, the second reactant gas may be $H_2$. The second reactant gas, as described above with reference with FIG. 1, is heated by the heating unit GH and supplied with a high-energy state, so the step coverage of a conductive layer to be deposited may be improved, and the deposition rate is increased to reduce an amount of source gas used. Moreover, the second reactant gas is supplied while having a relatively high particle velocity. Thus, even when the bulk layer is deposited on a structure with a high aspect ratio, the deposition imbalance caused by the flux imbalance may be prevented.

Figure 3A:
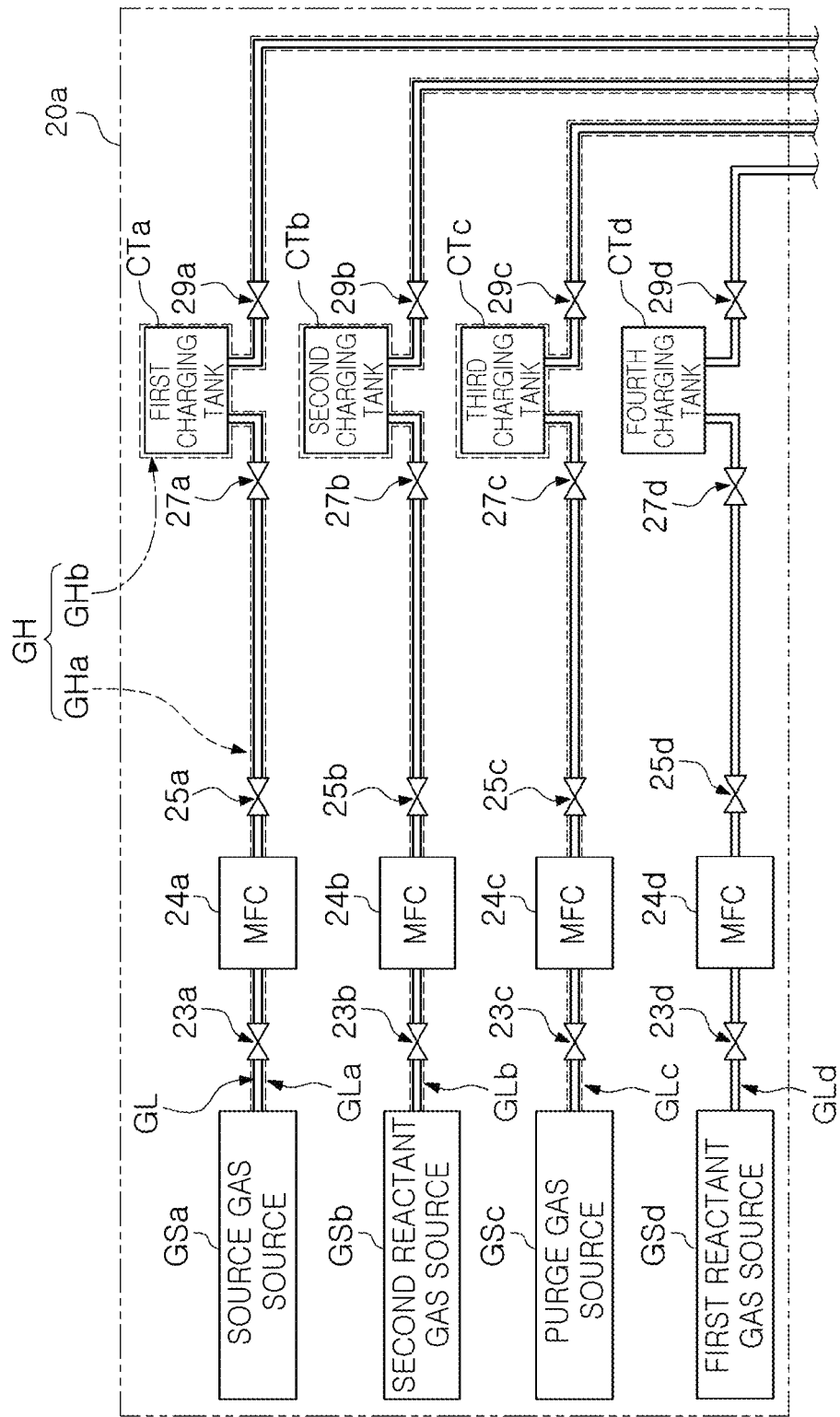
FIGS. 3A and 3B are schematic views of a gas supply unit of an apparatus for manufacturing a semiconductor device according to some example embodiments.
Figure 3B:
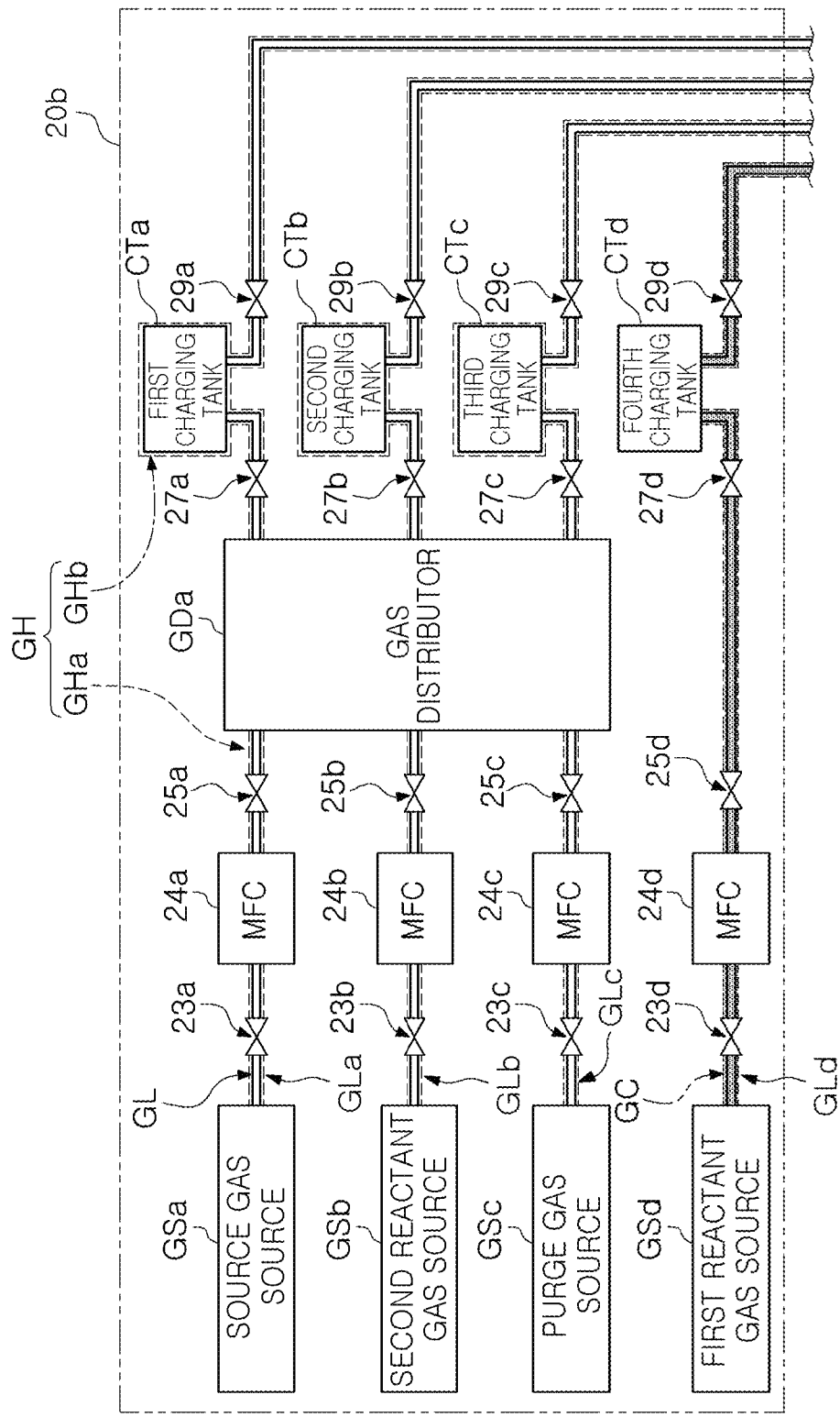

FIGS. 3A and 3B are schematic views of a gas supply unit of an apparatus for manufacturing a semiconductor device according to some example embodiments.

Referring to FIG. 3A, a gas supply unit 20a may not include a gas distributor GDa, in a manner different from some example embodiments of FIG. 1. Thus, second valves 25a, 25b, and 25c at the rear end of the first to third MFCs 24a, 24b, and 24c may be connected to third valves 27a, 27b, and 27c at the front end of the first to third charging tanks CTa, CTb, and CTc. In this case, according to some example embodiments, it is possible that the second valves 25a, 25b, and 25c or the third valves 27a, 27b, and 27c are omitted. As described above, in some example embodiments, whether the gas distributor GDa is included or not and the arrangement of the gas distributor GDa may be changed according to a size of an apparatus for manufacturing a semiconductor device, a placement of a substrate SUB in the deposition chamber 10, or the like.

Referring to FIG. 3B, a gas supply unit 20b, in a manner different from some example embodiments of FIG. 1, may further include a cooling unit GC surrounding a gas line GL extended from a fourth gas source GSd, a first reactant gas source, and a fourth charging tank CTd.

The cooling unit GC, also referred to herein as simply a "cooler," may be configured to cool the first reactant gas line GLd to cool a first reactant gas, supplied from the fourth gas source GSd, at a temperature of about 4° C. to about 40° C. The cooling unit GC may block the influence from the heating unit GH so that the first reactant gas is not heated by the heating unit GH. The cooling unit GC may include, for example, a cooling material, a device capable of cooling by the Peltier effect, or a cooling member such as a cooling fan. Thus, though the cooling unit GC is illustrated to surround the gas line GL in FIG. 3, the arrangement position and shape of the cooling unit GC may be variously changed in some example embodiments.

Figure 4:
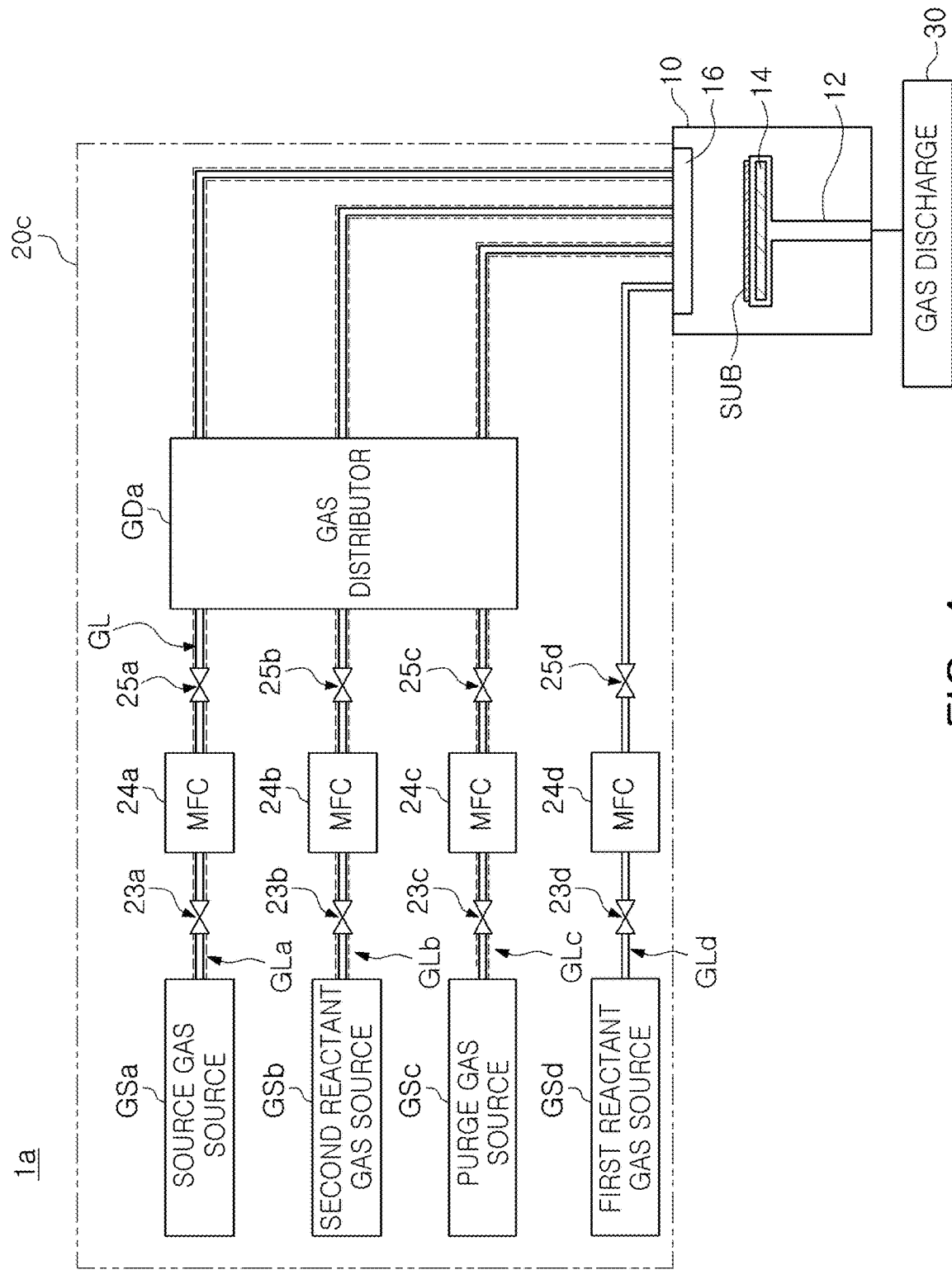
FIG. 4 is a schematic view illustrating an apparatus for manufacturing a semiconductor device according to some example embodiments.

FIG. 4 is a schematic view illustrating an apparatus for manufacturing a semiconductor device according to some example embodiments.

Referring to FIG. 4, in an apparatus for manufacturing a semiconductor device 1a, a gas supply unit 20c, in a manner different from some example embodiments of FIG. 1, may not include first to fourth charging tanks CTa, CTb, CTc, and CTd, and thus, gas lines GL may be directly extended from a gas distributor GDa and a fourth MFC 24d to a deposition chamber 10. The apparatus for manufacturing a semiconductor device 1a may be, for example, a chemical vapor deposition (CVD) apparatus. The descriptions with reference to FIG. 1 may be equally applied to descriptions of other configurations. Moreover, as described above with reference to FIG. 3A, a shape from which a gas distributor GDa is omitted, or the cooling unit GC as described above with reference to FIG. 3B may be applied to some example embodiments.

Figure 5:
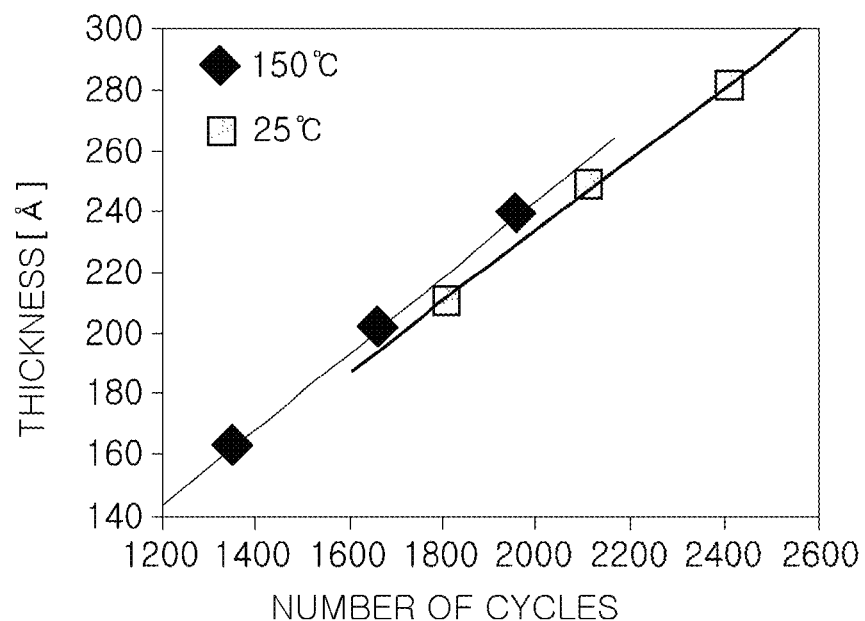
FIG. 5 is a graph illustrating a deposition rate by an apparatus for manufacturing a semiconductor device according to some example embodiments.

FIG. 5 is a graph illustrating a deposition rate by an apparatus for manufacturing a semiconductor device according to some example embodiments.

Referring to FIG. 5, thin film deposition rates by an example and a comparative example are illustrated. In an example, as in an apparatus for manufacturing a semiconductor device 1 of FIG. 1, a source gas, a reactant gas, and a purge gas were heated to about 150° C. and supplied to deposit a thin film. In a comparative example, the process gases were supplied at about 25° C., room temperature, without being heated, to deposit a thin film. As the number of deposition cycles was increased, a thickness of a thin film was also increased. Here, a slope refers to a deposition rate. In the case of a comparative example, a deposition rate was about 0.118 Å/cycle. In the case of an example, a deposition rate was about 0.126 Å/cycle, higher as compared with a comparative example.

From this result, although heating is performed to the substrate SUB by a substrate heating unit 14 in the deposition chamber 10 (see FIG. 1), it can be seen that process gases are hated and supplied to further increase a deposition rate. Moreover, according to an additional simulation result, it was also confirmed that the velocity of $WF_6$, a source gas, is increased.

Figure 6:
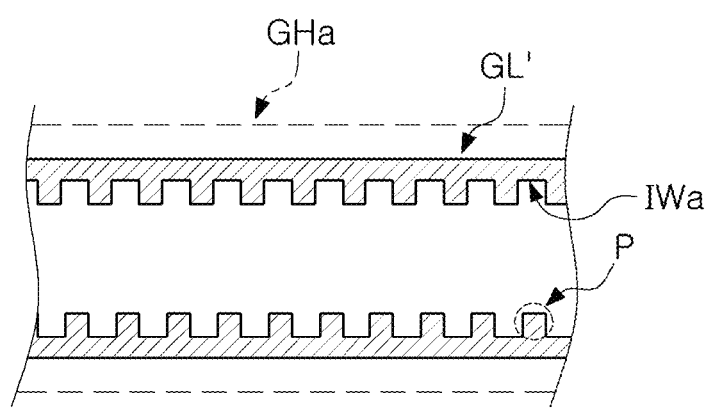
FIG. 6 is a schematic cross-sectional view of a gas line of an apparatus for manufacturing a semiconductor device according to some example embodiments.

FIG. 6 is a schematic cross-sectional view of a gas line of an apparatus for manufacturing a semiconductor device according to some example embodiments.

Referring to FIG. 6, a portion of a gas line GL', surrounded by a first heating unit GHa, is illustrated. The gas line GL' in some example embodiments may have an inner surface IWa having the form of a screw in which protruding portions P are disposed. Due to the structure described above, an area of the inner surface IWa of the gas line GL' could be increased, so the heating efficiency is improved. Each of the source gas line (e.g., GLa), the second reactant gas line (e.g., GLb), and/or the purge gas line (GLc) may be gas line GL'.

Figure 7A:
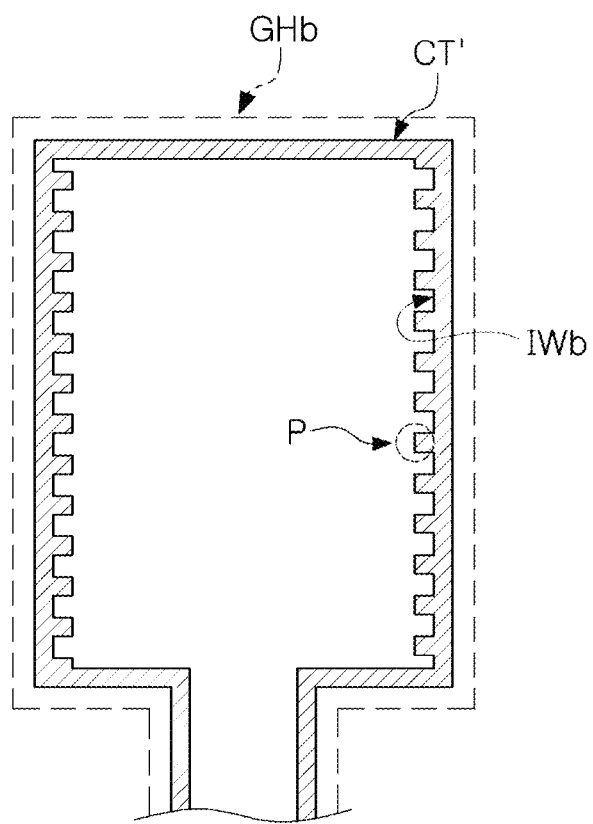
FIGS. 7A and 7B are schematic cross-sectional views of a charging tank of an apparatus for manufacturing a semiconductor device according to some example embodiments.
Figure 7B:
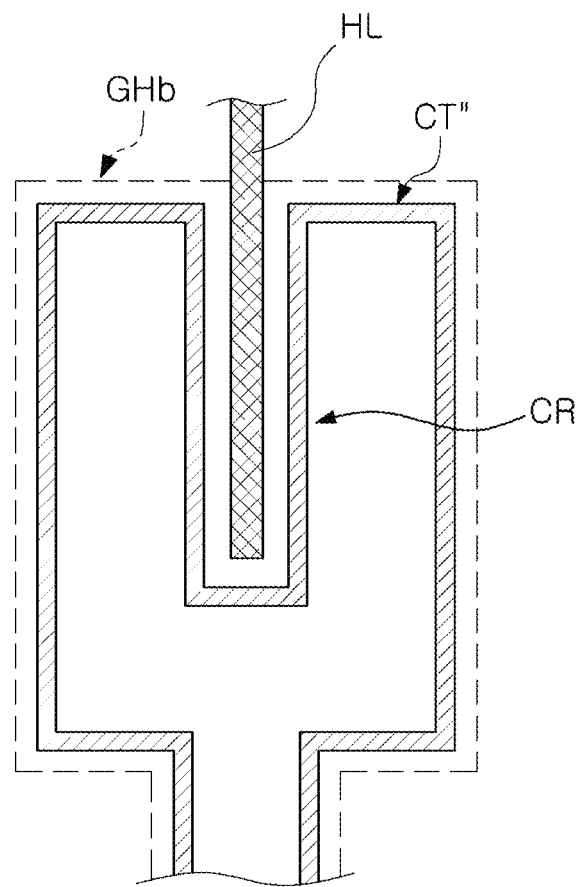

FIGS. 7A and 7B are schematic cross-sectional views of a charging tank of an apparatus for manufacturing a semiconductor device according to some example embodiments. FIGS. 7A and 7B illustrate charging tanks CT' and CT", surrounded by a second heating unit GHb, respectively.

Referring to FIG. 7A, a charging tank CT' according to some example embodiments, where charging tank CT' may be a charging tank of the portion of charging tanks surrounded by the second heating units GHb (e.g., CTa to CTc), may have an inner surface IWb having a screw form provided with protruding portions P. Due to the structure described above, an area of the inner surface IWb of the charging tank CT' could be increased, so the heating efficiency is improved. Each charging tank of the portion of charging tanks surrounded by the second heating units GHb (e.g., CTa to CTc) may be CT'.

Referring to FIG. 7B, a charging tank CT" according to some example embodiments, where charging tank CT" may be a charging tank of the portion of charging tanks surrounded by the second heating units GHb (e.g., CTa to CTc), has a central region CR in the form in which a tank wall is recessed inwardly from one side, and may include a heat-generating unit HL (also referred to herein as a heating element) interposed between the tank walls in the central region CR. That is, as shown in FIG. 7B, the heat-generating unit HL may be disposed in the form interposed in the center of the charging tank CT", while being surrounded by an outer side wall of the charging tank CT". The heat-generating unit HL may include, for example, a heating element such as a heating wire. Due to the structure described above, the heating efficiency is improved in the charging tank CT". Moreover, according to some example embodiments, it is also possible that the inner surface IWb in some example embodiments of FIG. 7A is applied together to a charging tank CT" according to some example embodiments. Each charging tank of the portion of charging tanks surrounded by the second heating units GHb (e.g., CTa to CTc) may be CT".

Figure 8A:
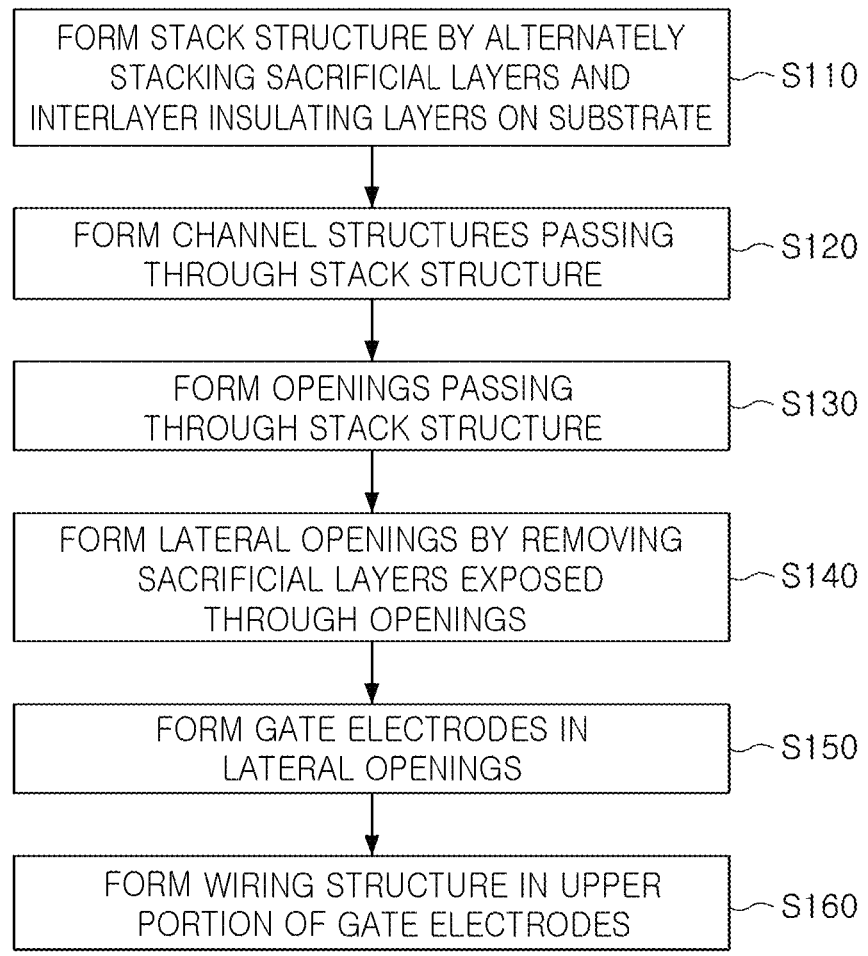
FIGS. 8A and 8B are schematic flow diagrams illustrating a method of manufacturing a semiconductor device according to some example embodiments.
Figure 8B:
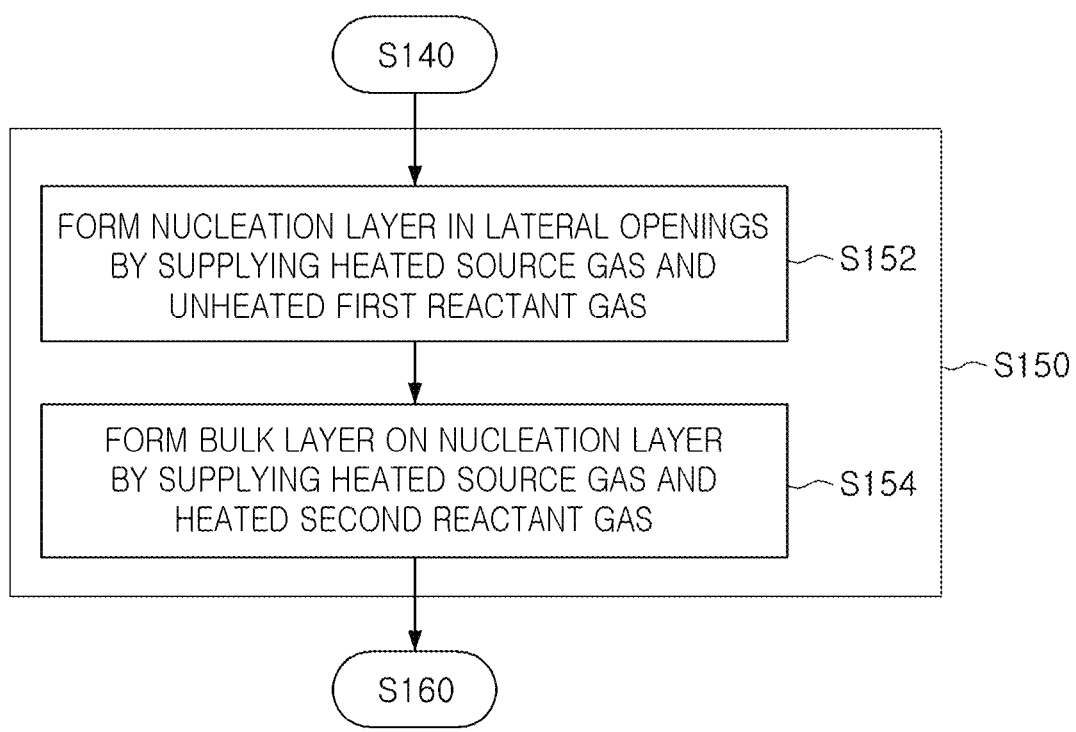

FIGS. 8A and 8B are schematic flow diagrams illustrating a method of manufacturing a semiconductor device according to some example embodiments.

FIGS. 9A to 9G are schematic views illustrating a method of manufacturing a semiconductor device according to some example embodiments for respective main operations.

Figure 9A:
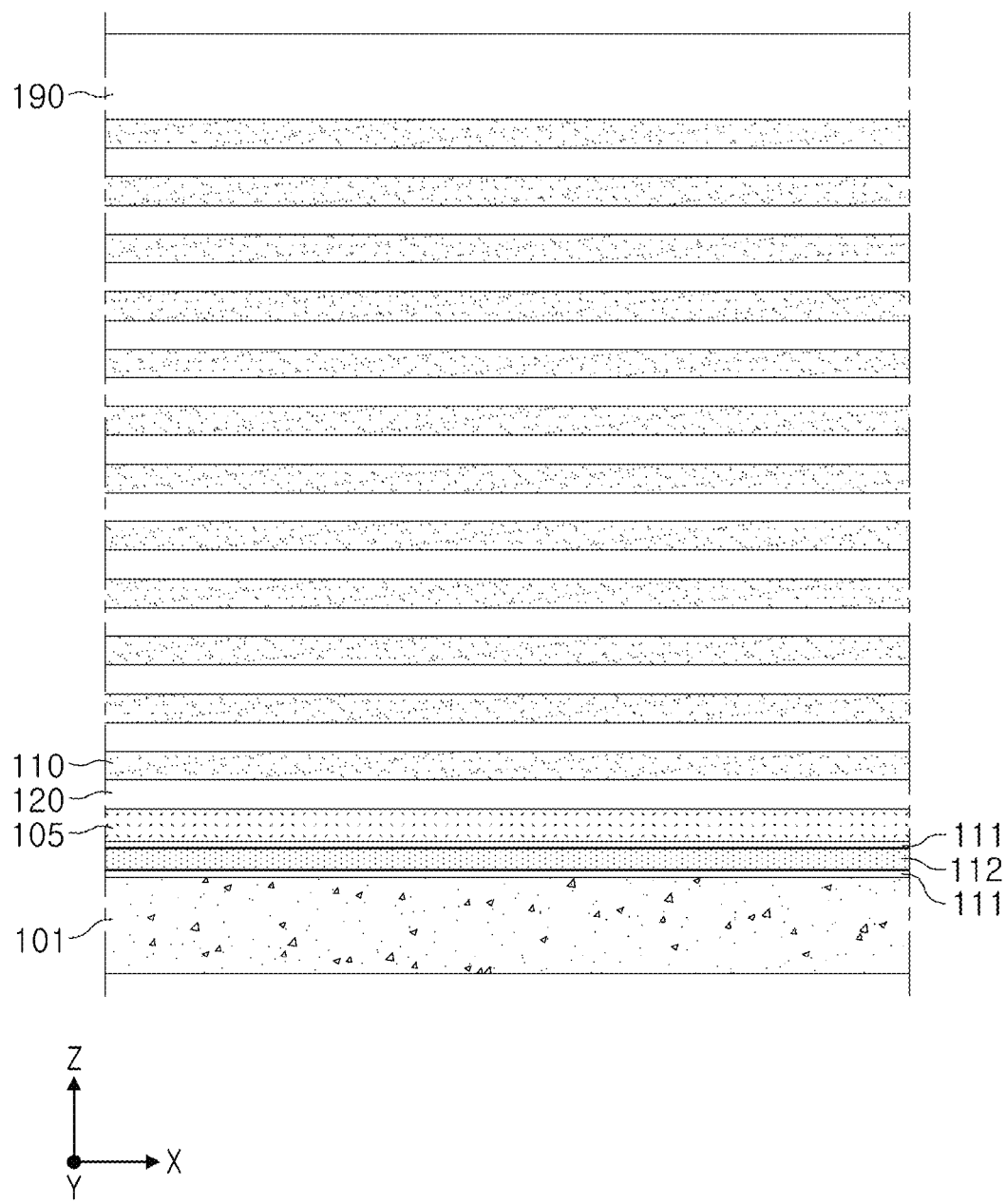
FIGS. 9A, 9B, 9C, 9D, 9E, 9F, and 9G are schematic views illustrating a method of manufacturing a semiconductor device according to some example embodiments for respective main operations.

Referring to FIGS. 8A and 9A, a plurality of sacrificial layers 110 and a plurality of interlayer insulating layers 120 are alternately stacked on a substrate 101 to form a stack structure (S110).

First, first and second horizontal sacrificial layers 111, 112 and a second horizontal conductive layer 105 are formed on the substrate 101. The substrate 101 may include a semiconductor material, for example, a group IV semiconductor, a group III-V compound semiconductor, or a group II-VI compound semiconductor. The first and second horizontal sacrificial layers 111 and 112 may include materials different from each other, and may be stacked on the substrate 101 to allow first horizontal sacrificial layers 111 to be disposed above and below the second horizontal sacrificial layer 112. The first and second horizontal sacrificial layers 111 and 112 may be layers to be replaced with a first horizontal conductive layer 104 (see FIG. 9C) through a subsequent process. For example, the first horizontal sacrificial layer 111 is formed of the same material as the interlayer insulating layers 120, while the second horizontal sacrificial layer 112 is formed of the same material as the sacrificial layers 110. The second horizontal conductive layer 105 may be deposited on the first and second horizontal sacrificial layers 111 and 112. The second horizontal conductive layer 105 includes a semiconductor material, and may include, for example, polycrystalline silicon.

Next, on the second horizontal conductive layer 105, sacrificial layers 110 and interlayer insulating layers 120 are alternately stacked. The sacrificial layers 110 may be a layer to be replaced with gate electrodes 130 (See FIG. 9F) through a subsequent process. The sacrificial layers 110 may be formed of a material different from the interlayer insulating layers 120. For example, the interlayer insulating layer 120 may include at least one of silicon oxide and silicon nitride, and the sacrificial layers 110 may include a material selected from silicon, silicon oxide, silicon carbide, and silicon nitride, and different from that of the interlayer insulating layer 120. In some example embodiments, all of thicknesses of the interlayer insulating layers 120 may not be the same. For example, an interlayer insulating layer 120 in a lowermost portion may be formed to have a relatively thin thickness, and an interlayer insulating layer 120 in an uppermost portion may be formed to have a relatively thick thickness. The thicknesses of the interlayer insulating layers 120 and the sacrificial layers 110 and the number of the interlayer insulating layers 120 and the sacrificial layers 110 may be variously changed from those illustrated in the drawings. A cell region insulating layer 190 may be formed on an uppermost portion. The cell region insulating layer 190 may include an insulating material such as a silicon oxide or a silicon nitride.

Figure 9B:
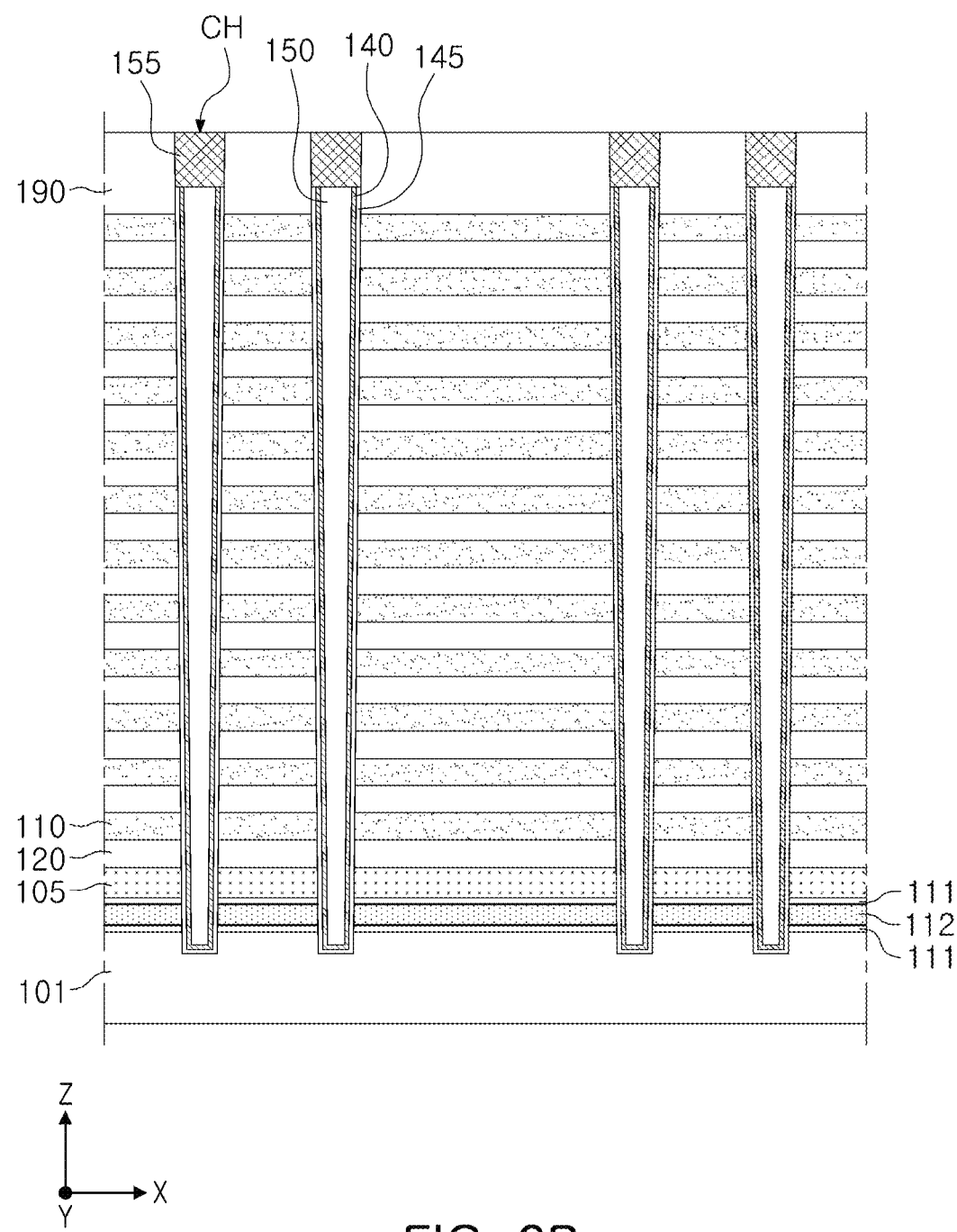

Referring to FIGS. 8A and 9B, a plurality of channel structures CH separately passing (e.g., extending) through the stack structure (e.g., through an entirety of the stack structure in a direction that is normal to an upper surface of the substrate 101) may be formed (S120).

First, for formation of the channel structures CH, channel holes are provided. The channel holes are formed by anisotropically etching the stack structure, and may be formed to have a hole shape. Due to a height of the stack structure, a side wall of the channel holes may not be perpendicular to an upper surface of the substrate 101. The channel holes may be formed to recess a portion of the substrate 101.

Next, in each of the channel holes, a gate dielectric layer 145, a channel layer 140, a channel insulating layer 150, and a channel pad 155 are formed, and thus channel structures CH may be formed. The gate dielectric layer 145 may be formed to have a uniform thickness using ALD or CVD. The gate dielectric layer 145 may include silicon oxide ($SiO_2$), silicon nitride ($Si_3N_4$), silicon oxynitride (SiON), a high-k dielectric material or combinations thereof. In this operation, the gate dielectric layer 145 may be formed in whole or in part, and a region of the gate dielectric layer 145 extended perpendicular to the substrate 101 along the channel structures CH may be formed. The channel layer 140 may be formed on the gate dielectric layer 145 in the channel holes CH. The channel layer 140 may include a semiconductor material such as polycrystalline silicon or single crystalline silicon, and the semiconductor material may be a material undoped with impurities, or a material containing p-type or n-type impurities. The channel insulating layer 150 may be formed to fill the channel holes, and may be an insulating material. However, according to some example embodiments, the channel holes may be filled with a conductive material, rather than the channel insulating layer 150. The channel pad 155 may be formed of a conductive material, for example, polycrystalline silicon.

According to some example embodiments, in the operation described above with reference with FIG. 9A, first and second horizontal sacrificial layers 111 and 112 and a second horizontal conductive layer 105 are not formed. In this case, an epitaxial layer connected to a channel layer 140 may be formed in a lower portion of the channel hole, in this operation.

Figure 9C:
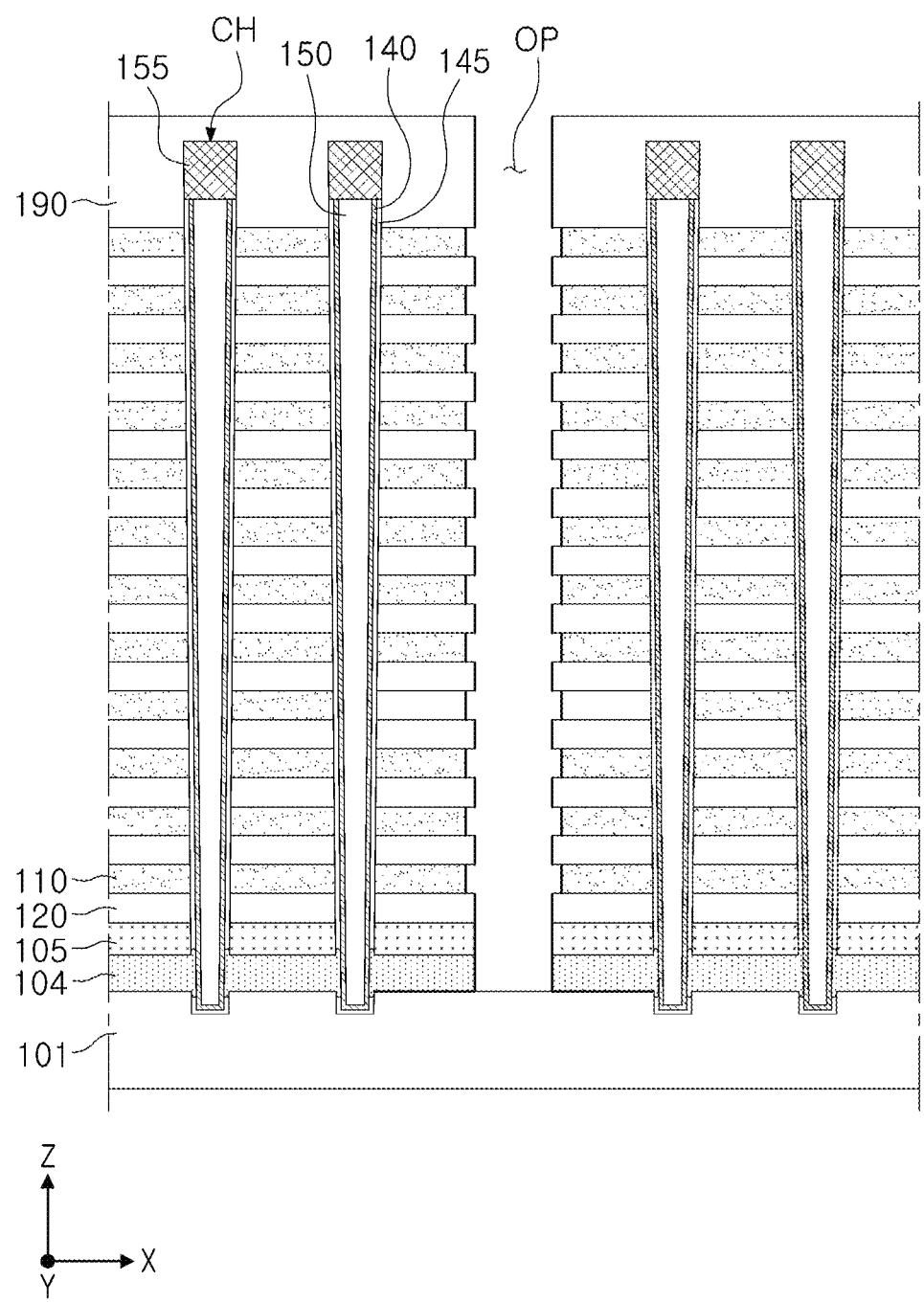

Referring to FIGS. 8A and 9C, a plurality of openings OP, separately passing (e.g., extending) through the stack structure, may be formed (e.g., through an entirety of the stack structure in a direction that is normal to an upper surface of the substrate 101) (S130).

First, the openings OP may be provided as a plurality of openings OP to separate the stack structure in an x-direction. Before the openings OP are formed, a cell region insulating layer 190 may be further formed on the channel pads 155. The openings OP may be provided by forming a mask layer using a photolithography process, and anisotropically etching the stack structure of sacrificial layers 110 and interlayer insulating layers 120. The openings OP may be provided in the form of a trench extended in a y-direction.

Next, after the first and second horizontal sacrificial layers 111 and 112 are removed through the openings OP, a first horizontal conductive layer 104 may be formed. When the first and second horizontal sacrificial layers 111 and 112 are removed, in order to protect the sacrificial layers 110, additional spacer layers are formed on a side wall of the openings OP, and then the second horizontal sacrificial layer 112 is removed first, and the first horizontal sacrificial layers 111 could be removed. The first and second horizontal sacrificial layers 111 and 112 may be removed, for example, by a wet etching process. During a removal process of the first horizontal sacrificial layers 111, an exposed gate dielectric layer 145 may be removed together from a region from which the second horizontal sacrificial layer 112 is removed. A conductive material is deposited in the region, from which the first and second horizontal sacrificial layers 111 and 112 are removed, to form a first horizontal conductive layer 104, and then the spacer layers could be removed. The first horizontal conductive layer 104 may be in directly contact with the channel layer 140. At least a portion of the first and second horizontal conductive layers 104 and 105 may function as a common source line of a semiconductor device 100, and may function as a common source line together with the substrate 101.

Figure 9D:
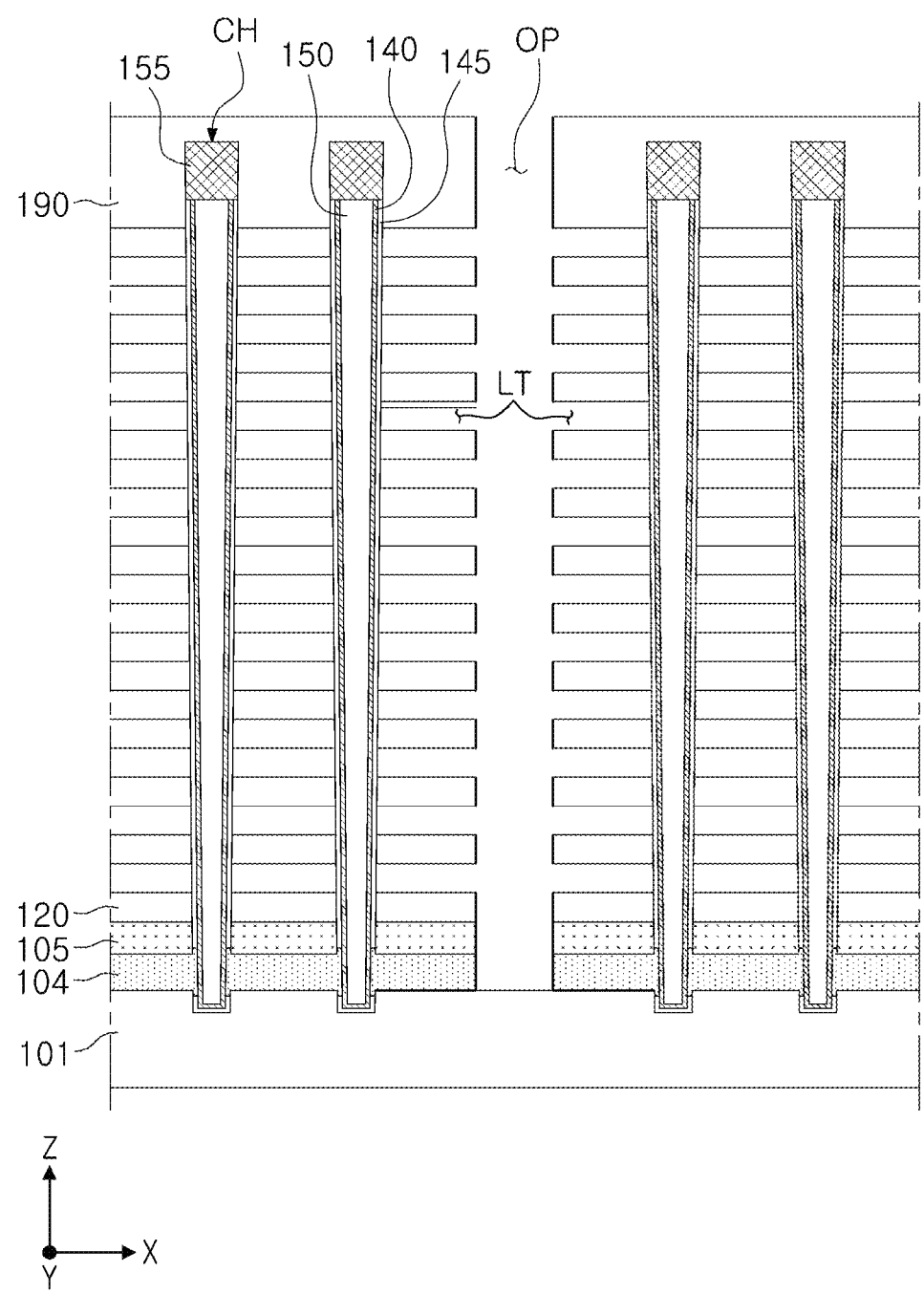

Referring to FIGS. 8A and 9D, the plurality of sacrificial layers 110, exposed by the openings OP, are removed to form a plurality of lateral openings LT (S140).

The sacrificial layers 110 may be removed selectively with respect to the interlayer insulating layers 120, using, for example, wet etching. Accordingly, a plurality of lateral openings LT may be formed between the interlayer insulating layers 120, and a portion of a side wall of the channel structures CH may be exposed through the lateral openings LT.

Figure 9E:
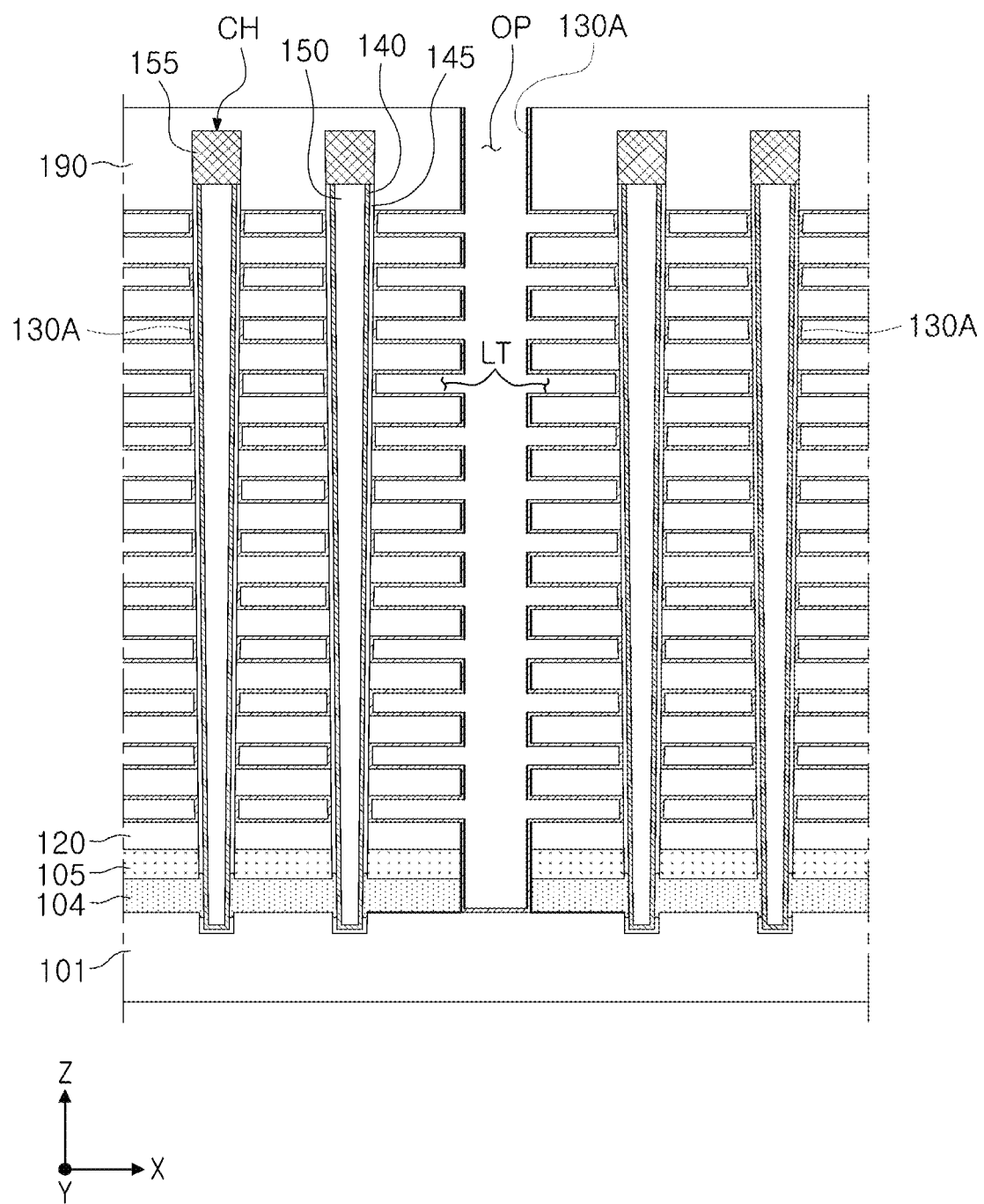
Figure 9F:
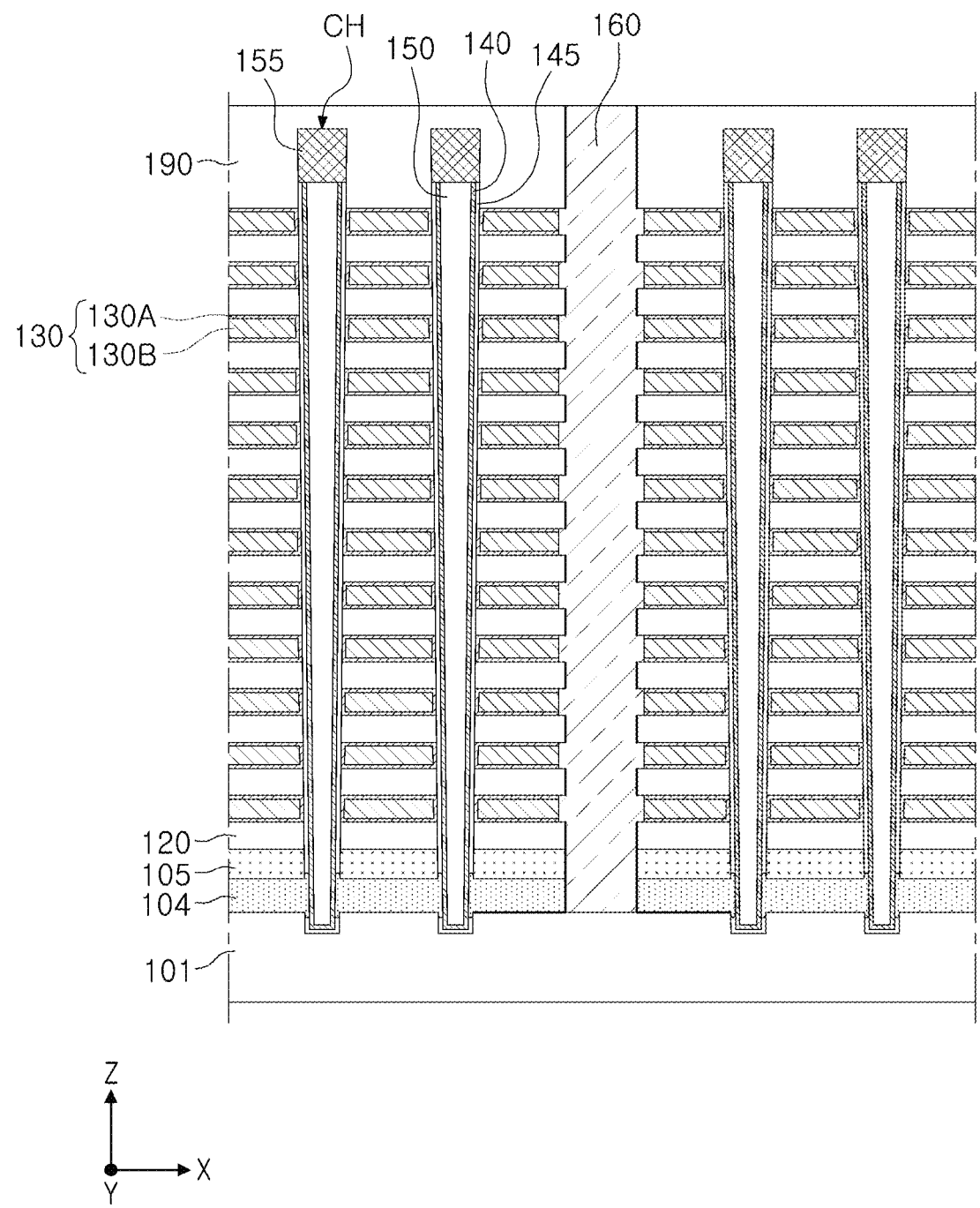

Referring to FIGS. 8A, 9E, and 9F, a plurality of gate electrodes 130 may be formed in separate, respective lateral openings LT of the plurality of lateral openings LT (S150).

First, referring to FIGS. 8B and 9E, a nucleation layer 130A of the gate electrodes 130 may be formed in the lateral openings LT (S152). As shown, the nucleation layer 130A may be formed on exposed surfaces of interlayer insulating layers 120 and/or gate dielectric layers 145. Such interlayer insulating layers 120 and/or gate dielectric layer 145 having the exposed surfaces on which the nucleation layer 130A is formed may be referred to herein as a substrate on which the nucleation layer 130A is formed.

The nucleation layer 130A may be formed using the apparatus for manufacturing a semiconductor device described above with reference to FIGS. 1, 3, 4, and 6 to 7B, for example. The nucleation layer 130A may be formed to have a substantially uniform thickness (e.g., a uniform thickness within manufacturing tolerances and/or material tolerances) along upper and lower surfaces of the interlayer insulating layers 120 and a side wall of the channel structures CH, and may be formed to have a thickness insufficient to fill the lateral openings LT. The nucleation layer 130A may have a thickness equal to or less than 3 nm, for example. According to some example embodiments, the gate electrodes 130 may further include a diffusion barrier outside, and the diffusion barrier may include, for example, tungsten nitride (WN), tantalum nitride (TaN), titanium nitride (TiN), or combinations thereof.

The nucleation layer 130A may be formed by sequentially supplying a heated source gas, an unheated first reactant gas, and a heated purge gas. In some example embodiments, the heated purge gas may be omitted. For example, due to the gas supply unit 20 of FIG. 1, the source gas is heated to a first temperature and supplied, while the first reactant gas is supplied at a second temperature which may be lower than the first temperature without being heated. For example, the source gas may be heated to a first temperature, for example may be heated to the first temperature by one or more heating units GH surrounding one or more gas lines GL of the gas supply unit 20, and may be supplied from the gas supply unit 20 at the first temperature, and the first reactant gas may be supplied at the second temperature, subsequently to the supplying of the source gas, without being heated, for example without being heated by any heating units GH of the gas supply unit 20. However, it will be understood that example embodiments are not limited thereto, and any of the aforementioned gases may be supplied at any time and/or at any temperature, for example concurrently and/or at different times in relation to each other and/or at any temperature. The purge gas is heated to a third temperature which may be equal to or lower than the first temperature and supplied. For example, the purge gas may be heated to a third temperature from the gas supply unit 20, for example may be heated to the third temperature by one or more heating units GH surrounding one or more gas lines GL of the gas supply unit 20, and may be supplied from the gas supply unit 20 at the third temperature. The purge gas may be supplied at the third temperature subsequently to the supplying of the source gas and the second reactant gas (e.g., the purge gas is supplied at the third temperature subsequently to the supplying of the first reactant gas at the second temperature, where the first reactant gas is, itself, supplied subsequently to the supplying of the source gas at the first temperature). However, it will be understood that example embodiments are not limited thereto, and any of the aforementioned gases may be supplied at any time and/or at any temperature; for example, two or more of said gases may be supplied concurrently and/or at different times in relation to each other and/or at any temperature. The first temperature and the third temperature range from about 80° C. to about 150° C., and particularly, range from about 100° C. to about 150° C. The second temperature ranges from about 4° C. to about 40° C. Process gases may be provided to the substrate 101 in the deposition chamber 10. A temperature of the substrate 101 in the deposition chamber 10, that is, a deposition temperature is higher than the first temperature, and may range from about 200° C. to about 750° C., for example. Restated, forming the nucleation layer 130A may include heating the substrate 101 to a fifth temperature in the deposition chamber, where the fifth temperature may be higher than the first temperature, and may range from about 200° C. to about 750° C., for example. The fifth temperature may be referred to herein as a deposition temperature. Accordingly, it will be understood that the first temperature, the second temperature, and/or the third temperature may be lower than a deposition temperature in the deposition chamber in which the forming of the gate electrodes 130 is performed. Thus, the source gas, the first reactant gas, and/or the purge gas may be supplied into the deposition chamber that is at the deposition temperature and which includes the substrate that is heated to the deposition temperature. Restated, the deposition chamber may be at a deposition temperature concurrently with the supplying of the source gas and the first reactant gas and/or the purge gas, where the first, second, and/or third temperatures are lower than the deposition temperature. However, it will be understood that example embodiments are not limited thereto, and any of the aforementioned gases may be supplied at any time in relation to the time at which the deposition chamber is at the deposition temperature, including before, during, or after such time.

In some example embodiments, the nucleation layer 130A is tungsten (W) (and thus the gate electrodes 130 that include the nucleation layer 130A include tungsten (W)), the source gas is $WF_6$, and the first reactant gas is at least one of $B_2H_6$, $SiH_4$, or $GeH_4$, such that a reactant gas supplied to form the gate electrodes 130 may include hydrogen (H). In detail, if the first reactant gas is $B_2H_6$, the first reactant gas is solid-powdered at a temperature higher than about 40° C., and thus may block the gas line GL or may interrupt normal supply of the first reactant gas. Thus, the first reactant gas may be supplied without being heated or while being cooled as described in some example embodiments of FIG. 3.

Next, referring to FIGS. 8B and 9F, a bulk layer 130B of a gate electrode 130 may be formed on the nucleation layer 130A to fill the lateral openings LT (S154). In some example embodiments, the gate electrodes 130 are formed via operation S150 that includes one of operation S152 or S154 and omits one of operation S152 or S154.

The bulk layer 130B may be formed using the apparatus for manufacturing a semiconductor device described above with reference to FIGS. 1, 3, 4, and 6 to 7B, for example. The bulk layer 130B may be formed to fill the lateral openings LT. The bulk layer 130B may have a thickness greater than that of the nucleation layer 130A, and may have, for example, a thickness in the range of 15 nm to 30 nm.

In detail, the bulk layer 130B may be formed by sequentially supplying a heated source gas, a heated second reactant gas, and a heated purge gas. In some example embodiments, the heated purge gas may be omitted. For example, due to the gas supply unit 20 of FIG. 1, the source gas is heated to the first temperature and supplied, while the second reactant gas heated to a fourth temperature which may be equal to or higher than the first temperature and supplied. For example, the source gas may be heated to the first temperature, for example may be heated to the first temperature by one or more heating units GH surrounding one or more gas lines GL of the gas supply unit 20, and may be supplied from the gas supply unit 20 at the first temperature, and the second reactant gas may be heated to the fourth temperature, for example may be heated to the fourth temperature by one or more heating units GH surrounding one or more gas lines GL of the gas supply unit 20, and may be supplied, subsequently to the supplying of the source gas, from the gas supply unit 20 at the fourth temperature. However, it will be understood that example embodiments are not limited thereto, and any of the aforementioned gases may be supplied at any time and/or at any temperature; for example, two or more of said gases may be supplied concurrently and/or at different times in relation to each other and/or at any temperature. The source gas and the second reactant gas may be heated by heating units GHb surrounding separate, respective charging tanks CTa, CTb of the gas supply unit 20. The purge gas is heated to a third temperature which may be equal to or lower than the first temperature and supplied. For example, the purge gas may be heated to the third temperature from the gas supply unit 20, for example may be heated to the third temperature by one or more heating units GH surrounding one or more gas lines GL of the gas supply unit 20, and may be supplied from the gas supply unit 20 at the third temperature. The fourth temperature ranges from about 80° C. to about 150° C., and particularly, ranges from about 100° C. to about 150° C. In some example embodiments, the first temperature may be equal to or lower than the fourth temperature. A temperature of the substrate 101 in the deposition chamber 10, that is, a deposition temperature is higher than the first temperature, and may range from about 200° C. to about 750° C., for example. Restated, forming the bulk layer 130B may include heating the substrate 101 to the fifth temperature in the deposition chamber, where the fifth temperature may be higher than the first temperature, and may range from about 200° C. to about 750° C., for example. The fifth temperature may be referred to herein as a deposition temperature. Accordingly, it will be understood that the first temperature, the second temperature, the third temperature, and/or the fourth temperature may be lower than a deposition temperature in the deposition chamber in which the forming of the gate electrodes 130 is performed. Thus, the source gas, the second reactant gas, and/or the purge gas may be supplied into the deposition chamber that is at the deposition temperature and which includes the substrate that is heated to the deposition temperature. Restated, the deposition chamber may be at a deposition temperature concurrently with the supplying of the source gas, the second reactant gas, and/or the purge gas, where the first, second, third, and/or fourth temperatures are lower than the deposition temperature. However, it will be understood that example embodiments are not limited thereto, and any of the aforementioned gases may be supplied at any time in relation to the time at which the deposition chamber is at the deposition temperature, including before, during, or after such time.

The bulk layer 130B may be tungsten (W), and thus the gate electrodes 130 may include tungsten (W), while the source gas and the purge gas may be gases the same as that used in the formation of the nucleation layer 130A, but are not limited thereto. The second reactant gas may be a material different from the first reactant gas used in the formation of the nucleation layer 130A. For example, the second reactant gas may be $H_2$. Thus, a reactant gas supplied to form the gate electrodes 130 may include hydrogen (H).

In some example embodiments, during the formation of the nucleation layer 130A and the bulk layer 130B, a functional gas may be further supplied to allow the nucleation layer 130A and the bulk layer 130B to contain impurities, in addition to the source gas, and the first and second reactant gases. In this case, the functional gas may be heated and supplied in a manner similar to the purge gas, but is not limited thereto.

Due to the process operations, gate electrodes 130, including the nucleation layer 130A and the bulk layer 130B, respectively, may be provided. The gate electrodes 130 may be deposited by supplying at least a portion of the source gas and reactant gas in a heated state as described above. Thus, even when the stacking number of the gate electrodes 130 is increased and thus an aspect ratio of the stack structure is increased, step-coverage could be ensured. Moreover, the deposition rate is increased, and thus an amount of process gases used may be significantly reduced, and the flux imbalance could be significantly reduced in an upper portion and a lower portion of the stack structure, so the uniformity of deposition thus achieved could be ensured.

Then, through an additional process, in order to only place a gate electrode 130 in the lateral openings LT, a material forming the gate electrode 130 formed in the openings OP may be removed by an etching process. For an electrical separation between gate electrodes 130 vertically adjacent to each other, a side surface of the gate electrodes 130 may be formed to be recessed inwardly toward the channel structures CH as compared with a side surface of the interlayer insulating layers 120, but is not limited thereto. Next, an insulating material is deposited in the openings OP to form a separation insulating layer 160. The separation insulating layer 160 may include an insulating material such as silicon oxide, silicon nitride, or silicon oxynitride. According to some example embodiments, a conductive layer may be further disposed in the separation insulating layer 160, and, in this case, the conductive layer may be electrically connected to the first and second horizontal conductive layers 104 and 105 and/or the substrate 101.

Figure 9G:
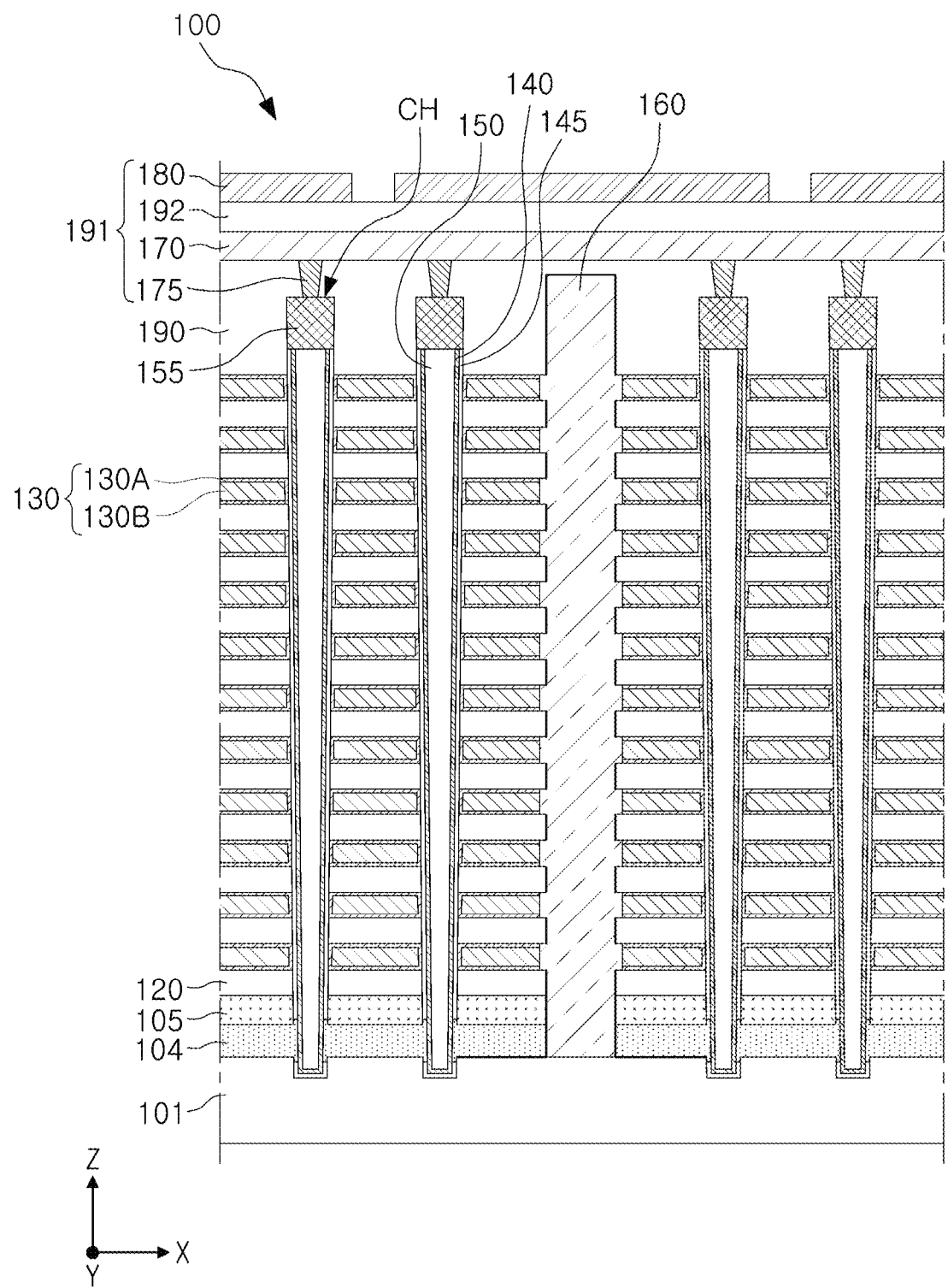

Referring to FIGS. 8A and 9G, a wiring structure 191 including wiring lines may be formed in an upper portion of the gate electrodes 130 (S160), to complete forming a semiconductor device 100. It will be understood that in some example embodiments the wiring structure 191 may be omitted semiconductor device 100, and thus operation S160 may be omitted in some example embodiments.

First, a cell region insulating layer 190 may be further formed on the separation insulating layer 160. Next, a wiring structure 191 is formed, and the wiring structure 191 includes channel contact plugs 175 passing through the cell region insulating layer 190 and connected to the channel structures CH, bit lines 170 connected to the channel contact plugs 175, and wiring lines 180 disposed in an upper portion of the bit lines 170 and connected to the bit lines 170 in an unillustrated region. An upper insulating layer 192 may be further formed between the bit lines 170 and the wiring lines 180.

In some example embodiments, at least a portion of the wiring structure 191 may include a material the same as the gate electrodes 130, for example, tungsten (W). In this case, the wiring structure 191 including tungsten (W) may be also formed by depositing a nucleation layer and a bulk layer, as described with reference with FIGS. 8B, 9E, and 9F, using an apparatus for manufacturing a semiconductor device according to the example embodiments described above. That is, the wiring structure 191 may be also formed by heating and supplying a portion of process gases, in a manner similar to the gate electrodes 130. For example, forming the wiring structure may include forming a separate nucleation layer (e.g., lower portions of channel contact plugs 175, a bottom portion of bit lines 170 that is in contact with the cell region insulating layer 190, etc.) by supplying the source gas and the first reactant gas as described above with regard to forming the nucleation layer 130A, and forming a separate bulk layer (e.g., a remainder portion of the channel contact plugs 175 and/or bit lines 170, etc.) on the separate nucleation layer by supplying the source gas and the second reactant gas as described above with regard to forming the bulk layer 130B. However, in some example embodiments, the gate electrodes 130 may be formed using an apparatus for manufacturing a semiconductor device of FIG. 1, FIG. 3A, or FIG. 3B, while the wiring structure 191 is formed using an apparatus for manufacturing a semiconductor device of FIG. 4. In some example embodiments, the forming of the gate electrodes 130 via forming the nucleation layer 130A and bulk layer 130B includes storing the source gas, the first reactant gas, and the second reactant gas in respective charging tanks in the gas supply unit 20 (e.g., CTa, CTb, CTd) and subsequently supplying the stored source gas, the stored first reactant gas, and the stored second reactant gas to form the gate electrodes 130. However, it will be understood that example embodiments are not limited thereto, and any of the aforementioned gases may be supplied at any time and/or at any temperature; for example, two or more of said gases may be supplied concurrently and/or at different times in relation to each other and/or at any temperature. In some example embodiments, the forming of the wiring structure 191 via the forming of the separate nucleation layer and the forming of the separate bulk layer includes supplying the source gas, the first reactant gas, and the second reactant gas without storing any of the source gas, the first reactant gas, or the second reactant gas in any charging tanks (e.g., because the forming of the separate nucleation layer and the forming of the separate bulk layer includes supplying the source gas, the first reactant gas, and the second reactant gas from the gas supply unit 20c shown in FIG. 4, which does not include any charging tanks).

As set forth above, according to some example embodiments of the present inventive concepts, a method of manufacturing a semiconductor device is provided, and a semiconductor device with improved reliability may be manufactured thereby, by selectively heating and supplying a process gas, when a wiring structure 191 is formed. Moreover, an apparatus for manufacturing a semiconductor device capable of efficiently implementing the method of manufacturing a semiconductor device described above may be provided.

While some example embodiments have been shown and described above, it will be apparent to those skilled in the art that modifications and variations could be made without departing from the scope of the present disclosure, as defined by the appended claims.

What is claimed is:

1. A method of manufacturing a semiconductor device, the method comprising:
  forming a stack structure by alternately stacking a plurality of sacrificial layers and a plurality of interlayer insulating layers on a substrate;
  forming a plurality of channel structures separately extending through the stack structure;
  forming a plurality of openings separately extending through the stack structure;
  forming a plurality of lateral openings by removing the plurality of sacrificial layers exposed by the plurality of openings;
  forming a plurality of gate electrodes in separate, respective lateral openings of the plurality of lateral openings; and
  forming a wiring structure in an upper portion of the gate electrodes,
  wherein the forming the gate electrodes includes
  forming a nucleation layer in the plurality of lateral openings, by supplying a source gas and a first reactant gas, and
  forming a bulk layer on the nucleation layer to fill the plurality of lateral openings, by supplying the source gas and a second reactant gas, the second reactant gas being different from the first reactant gas,
  wherein the source gas is heated to a first temperature and is supplied from a gas supply unit in a deposition apparatus at the first temperature, the second reactant gas is heated to a second temperature and is supplied from the gas supply unit in the deposition apparatus at the second temperature, and the first reactant gas is supplied without being heated and is supplied at a third temperature that is lower than the first temperature and lower than the second temperature.

2. The method of claim 1, wherein the source gas and the second reactant gas are heated by heating units surrounding one or more gas lines of the gas supply unit and the first reactant gas is supplied without being heated by any heating units of the gas supply unit.

3. The method of claim 1, wherein the source gas and the second reactant gas are heated by heating units surrounding separate, respective charging tanks of the gas supply unit.

4. The method of claim 1, wherein the first and second temperatures each range from about 80° C. to about 150° C.

5. The method of claim 1, wherein the third temperature ranges from about 4° C. to about 40° C.

6. The method of claim 1, wherein the first temperature is equal to or lower than the second temperature.

7. The method of claim 1, wherein
  the forming the nucleation layer includes supplying a purge gas subsequently to supplying the source gas and the first reactant gas,
  the forming the bulk layer includes supplying the purge gas subsequently to supplying the source gas and the second reactant gas, and the purge gas is heated to a fourth temperature and is supplied from the gas supply unit in the deposition apparatus at the fourth temperature.

8. The method of claim 7, wherein the fourth temperature is equal to or lower than the first temperature.

9. The method of claim 1, wherein the first reactant gas is at least one of $B_2H_6$, $SiH_4$, or $GeH_4$.

10. The method of claim 1, wherein the second reactant gas is $H_2$.

11. The method of claim 1, wherein the gate electrodes include tungsten (W) and the source gas is $WF_6$.

12. The method of claim 1, wherein
the forming the nucleation layer includes heating the substrate to a fifth temperature in a deposition chamber in the deposition apparatus, the fifth temperature being higher than the first temperature, and
the forming the bulk layer includes heating the substrate to the fifth temperature in the deposition chamber in the deposition apparatus.

13. The method of claim 12, wherein the fifth temperature ranges from about 200° C. to about 750° C.

14. The method of claim 1, wherein the forming the wiring structure includes
forming a separate nucleation layer by supplying the source gas and the first reactant gas, and
forming a separate bulk layer on the separate nucleation layer by supplying the source gas and the second reactant gas.

15. The method of claim 14, wherein
the forming the gate electrodes includes storing the source gas, the first reactant gas, and the second reactant gas in separate, respective charging tanks in the gas supply unit and subsequently supplying the stored source gas, the stored first reactant gas, and the stored second reactant gas from the respective charging tanks, and
the forming the wiring structure includes supplying the source gas, the first reactant gas, and the second reactant gas without storing any of the source gas, the first reactant gas, or the second reactant gas in any charging tanks.

16. A method of manufacturing a semiconductor device, the method comprising:
forming a stack structure by alternately stacking a plurality of sacrificial layers and a plurality of interlayer insulating layers on a substrate;
forming a plurality of channel structures separately extending through the stack structure;
forming a plurality of openings separately extending through the stack structure;
forming a plurality of lateral openings by removing the plurality of sacrificial layers exposed by the plurality of openings; and
forming a plurality of gate electrodes in the plurality of lateral openings,
wherein the forming the plurality of gate electrodes includes
supplying a source gas containing tungsten (W), wherein the source gas is heated to a first temperature and is supplied in a deposition apparatus at the first temperature,
supplying a reactant gas containing hydrogen (H), wherein the reactant gas is heated to a second temperature and is supplied in the deposition apparatus at the second temperature, and
supplying a purge gas,
wherein the first and second temperatures are lower than a deposition temperature in a deposition chamber in which the forming the gate electrodes is performed, the deposition chamber being at the deposition temperature during both the sup wing the source gas and the supplying the reactant gas.

17. The method of claim 16, wherein the purge gas is heated to a third temperature and is supplied in the deposition apparatus at the third temperature.

18. A method of manufacturing a semiconductor device, the method comprising:
forming a nucleation layer on a substrate, by supplying a source gas and a first reactant gas into a deposition chamber in a deposition apparatus, the deposition chamber being at a deposition temperature; and
forming a bulk layer on the nucleation layer, by supplying the source gas and a second reactant gas into the deposition chamber, the deposition chamber being at the deposition temperature,
wherein the source gas is heated to a first temperature and is supplied from a gas supply unit in the deposition apparatus at the first temperature, the second reactant gas is heated to a second temperature and is supplied from the gas supply unit in the deposition apparatus at the second temperature,
wherein the first and second temperatures are both lower than the deposition temperature.

19. The method of claim 18, wherein the first reactant gas is supplied without being heated and is supplied at a third temperature that is lower than the first temperature and lower than the second temperature.

* * * * *